United States Patent [19]

Menis et al.

[11] Patent Number: 5,200,696

[45] Date of Patent: Apr. 6, 1993

[54] TEST SYSTEM APPARATUS WITH SCHOTTKY DIODES WITH PROGRAMMABLE VOLTAGES

[75] Inventors: David Menis, Cohasset, Mass.; Harold S. Vitale, Los Gatos, Calif.; Phillip D. Burlison, Morgan Hill, Calif.; William R. DeHaven, Los Altos, Calif.

[73] Assignee: LTX Corporation, Westwood, Mass.

[21] Appl. No.: 756,325

[22] Filed: Sep. 6, 1991

Related U.S. Application Data

[63] Continuation-in-part of Ser. No. 581,514, Sep. 10, 1990, abandoned.

[51] Int. Cl.$^5$ .................................................. G01R 31/22
[52] U.S. Cl. ............................... 324/158 R; 324/73.1; 371/15.1; 371/20.1
[58] Field of Search .............. 324/158 R, 158 F, 73.1; 371/1, 15.1, 27, 22.6, 20.1; 333/246, 248

[56] References Cited

U.S. PATENT DOCUMENTS

| | | | |
|---|---|---|---|
| 3,549,995 | 12/1970 | Trousdale et al. | 324/73.1 |
| 3,631,229 | 12/1971 | Bems et al. | 371/22.6 |
| 4,517,512 | 5/1985 | Petrich et al. | 324/73.1 |
| 4,523,312 | 6/1985 | Takeuchi | 324/73.1 |
| 4,583,223 | 4/1986 | Inoue et al. | 324/73.1 |
| 4,605,894 | 8/1986 | Cox et al. | 324/158 F |

(List continued on next page.)

OTHER PUBLICATIONS

*Teradyne J971 Spectrum Architecture*, Teradyne, Inc.
*Teradyne J971 System Description*, Teradyne, Inc., pp. 1–21 (May 1991).
*Teradyne J971 Preliminary Specification (100 MHz Version)*, Teradyne, Inc. pp. 1–15 (Jun. 25, 1991).
D. F. Murray and C. M. Nash, *Critical Parameters for High-Performance Dynamic Response Measurements*, Semiconductor Test Systems Division (STS), Tektronix, Inc., pp. 462–471 (IEEE 1990).

H. Vitale, *High Speed CMOS Reflection Reduction*, Trillium Engineering, Trillium Applications Note No. APN 028 (Aug. 1988).
H. Vitale, *Use of the Programmable Load to Reduce Reflections in Test Applications of High Speed CMOS*, (List continued on next page.)

*Primary Examiner*—Vinh Nguyen
*Attorney, Agent, or Firm*—Blakely, Sokoloff, Taylor & Zafman

[57] ABSTRACT

An apparatus for a test system for testing an electronic circuit. The apparatus includes an interconnect path, a comparator, a programmable apparatus, a first Schottky diode, and a second Schottky diode. The interconnect path has a first end and a second end. The first end of the interconnect path is coupled to the electronic circuit under test. The interconnect path transmits a signal from the electronic circuit under test to the second end of the interconnect path. The comparator is coupled to the second end of the interconnect path for receiving and comparing the signal from the electronic circuit under test with a reference voltage. The comparator has a high input impedance. The comparator provides an output signal to the test system. The programmable apparatus provides a selectable first voltage and a selectable second voltage. A first Schottky diode is provided for reducing ringing of the signal from the electronic circuit under test. A first end of the first Schottky diode is coupled to the interconnect path at a point near the comparator. A second end of the first Schottky diode is coupled to the selectable first voltage. A second Schottky diode is provided for reducing ringing of the signal from the electronic circuit under test. A first end of the second Schottky diode is coupled to the selectable second voltage. The second end of the second Schottky diode is coupled to the interconnect path at a point near the comparator.

6 Claims, 12 Drawing Sheets

U.S. PATENT DOCUMENTS

| | | | |
|---|---|---|---|
| 4,623,799 | 11/1986 | Nyman, Jr. | 324/73.1 |
| 4,636,716 | 1/1987 | Welzhofer | 324/158 R |
| 4,675,673 | 6/1987 | Oliver | 324/158 F |
| 4,694,242 | 9/1987 | Peterson et al. | 324/158 R |
| 4,720,671 | 1/1988 | Tada et al. | 324/158 R |
| 4,928,062 | 5/1990 | Miles et al. | 324/158 R |
| 5,086,271 | 2/1992 | Haill et al. | 324/73.1 |

OTHER PUBLICATIONS

Trillium Test Systems Applications Note (Oct. 1987).

*Motorola High-Speed CMOS Integrated Circuits,* Motorola, Inc. pp. 4—4 (1983).

*Fairchild Advanced CMOS Technology Logic Data Book,* Fairchild Semiconductor Corp., pp. 2-3 to 2-7 (1987).

*MECL System Design Handbook,* Motorola, Inc., pp. 77-81 (1983).

J. Millman, *Microelectronics-Digital and Analog Circuits and Systems,* pp. 338-343 (1979).

*Product Description,* Rev. 2, pp. 33-34 (May 1986).

M. Ferland, *Device Output Loading,* IEEE, pp. 130-132 (1978).

MegaOne VLSI Test System, Megatest Corp., 3 pages (1983).

*J967 VLSI Test System,* Teradyne, Inc. p. 25 (May, 1985).

FIG—1 (PRIOR ART)

FIG_2 (PRIOR ART)

FIG_3 (PRIOR ART)

FIG_5

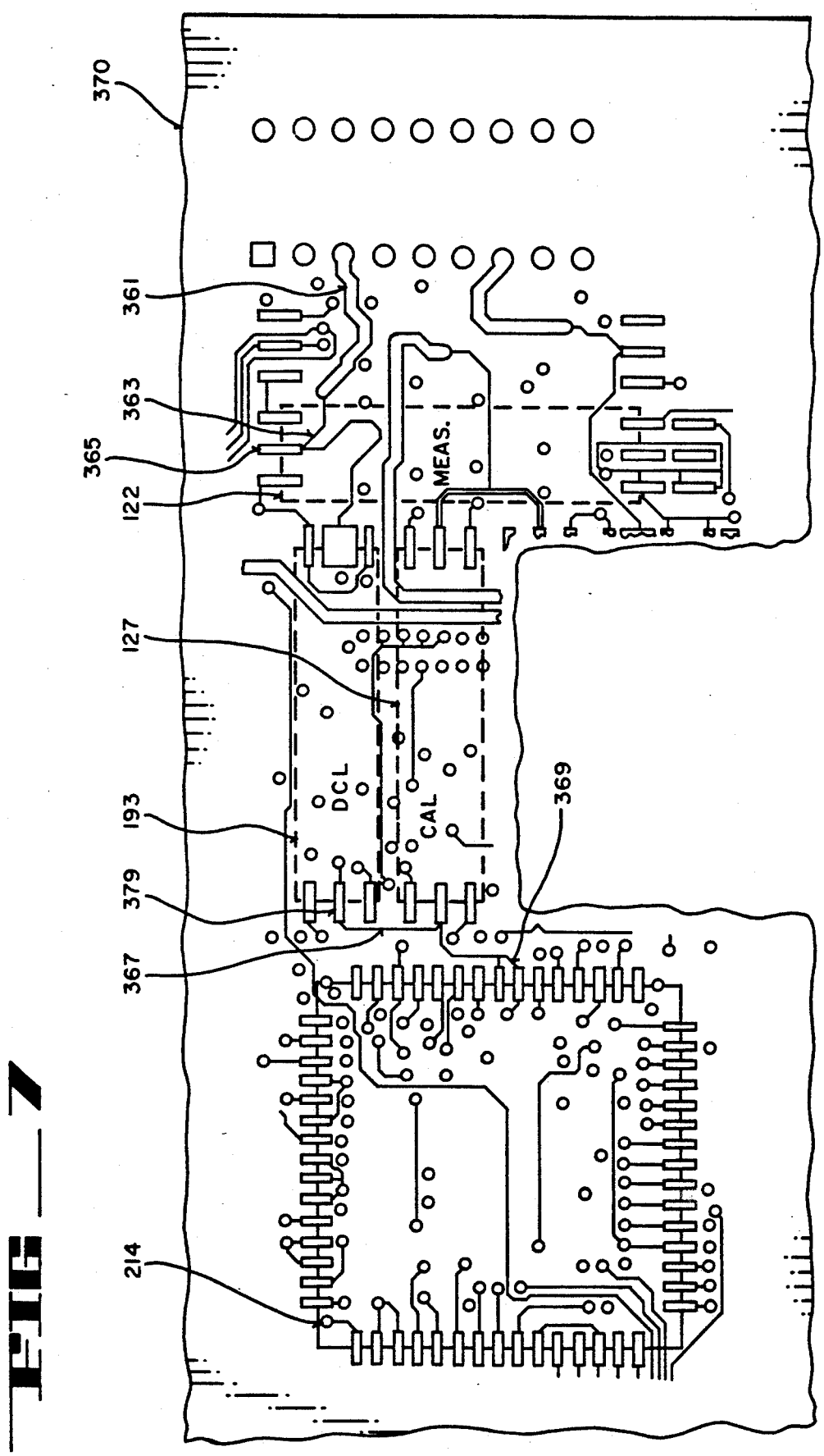
FIG—7

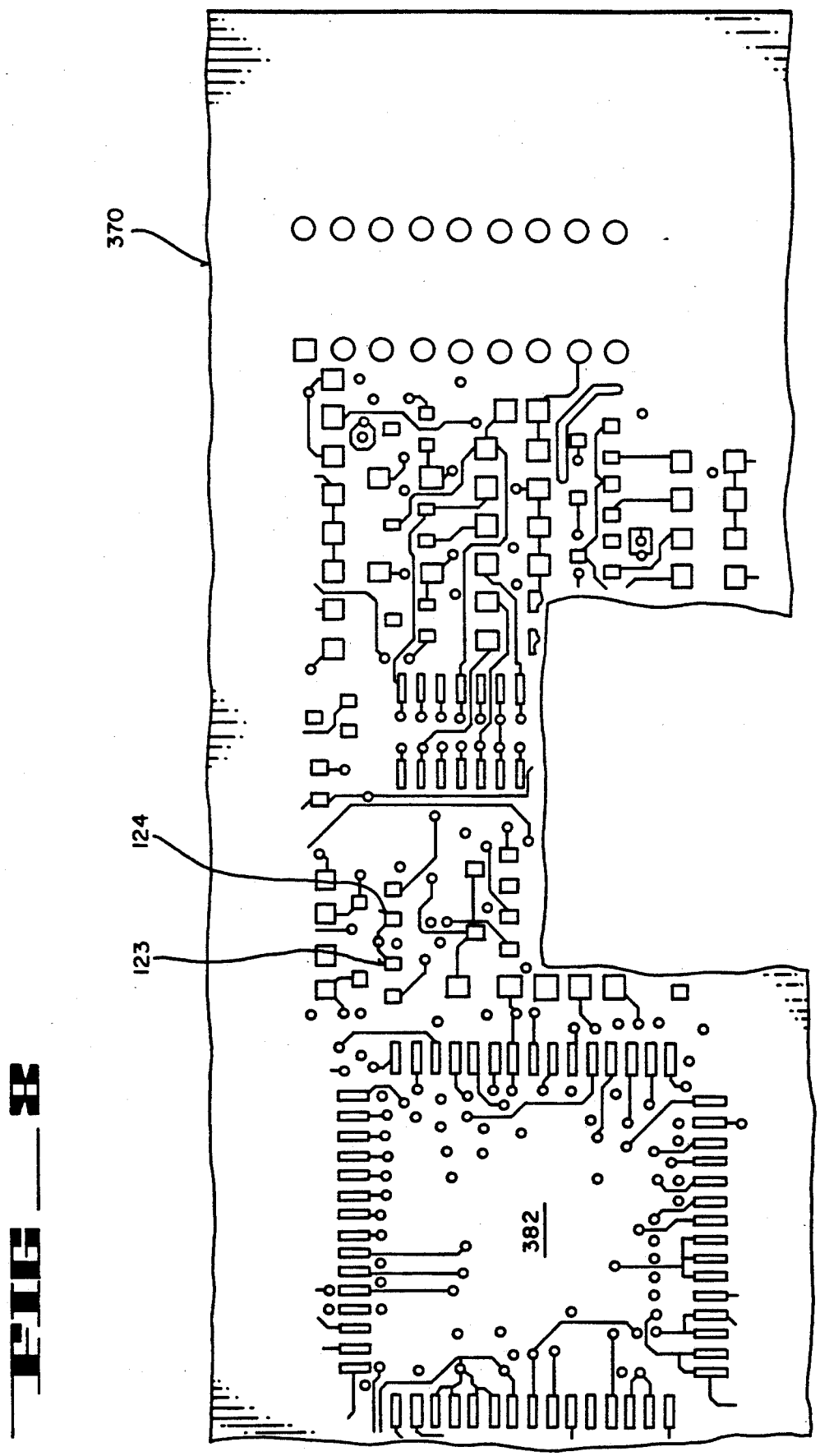

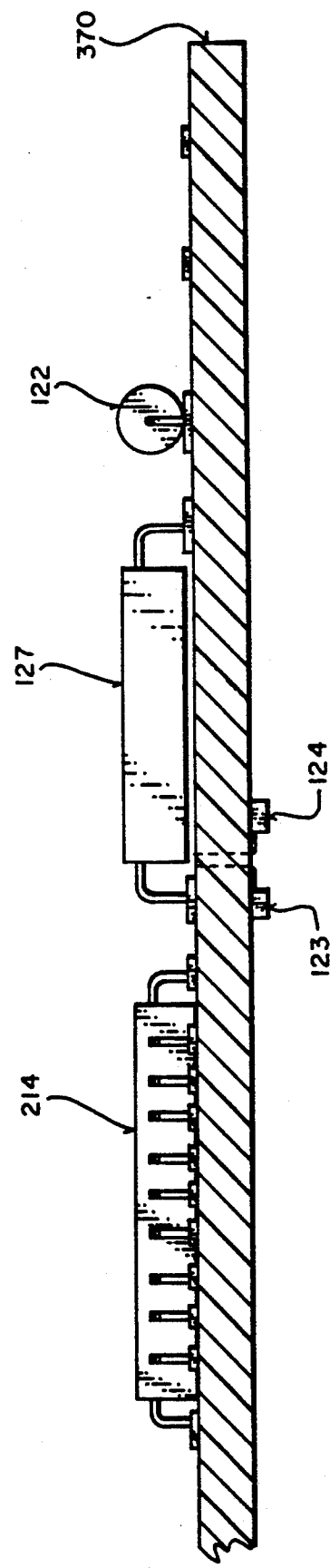

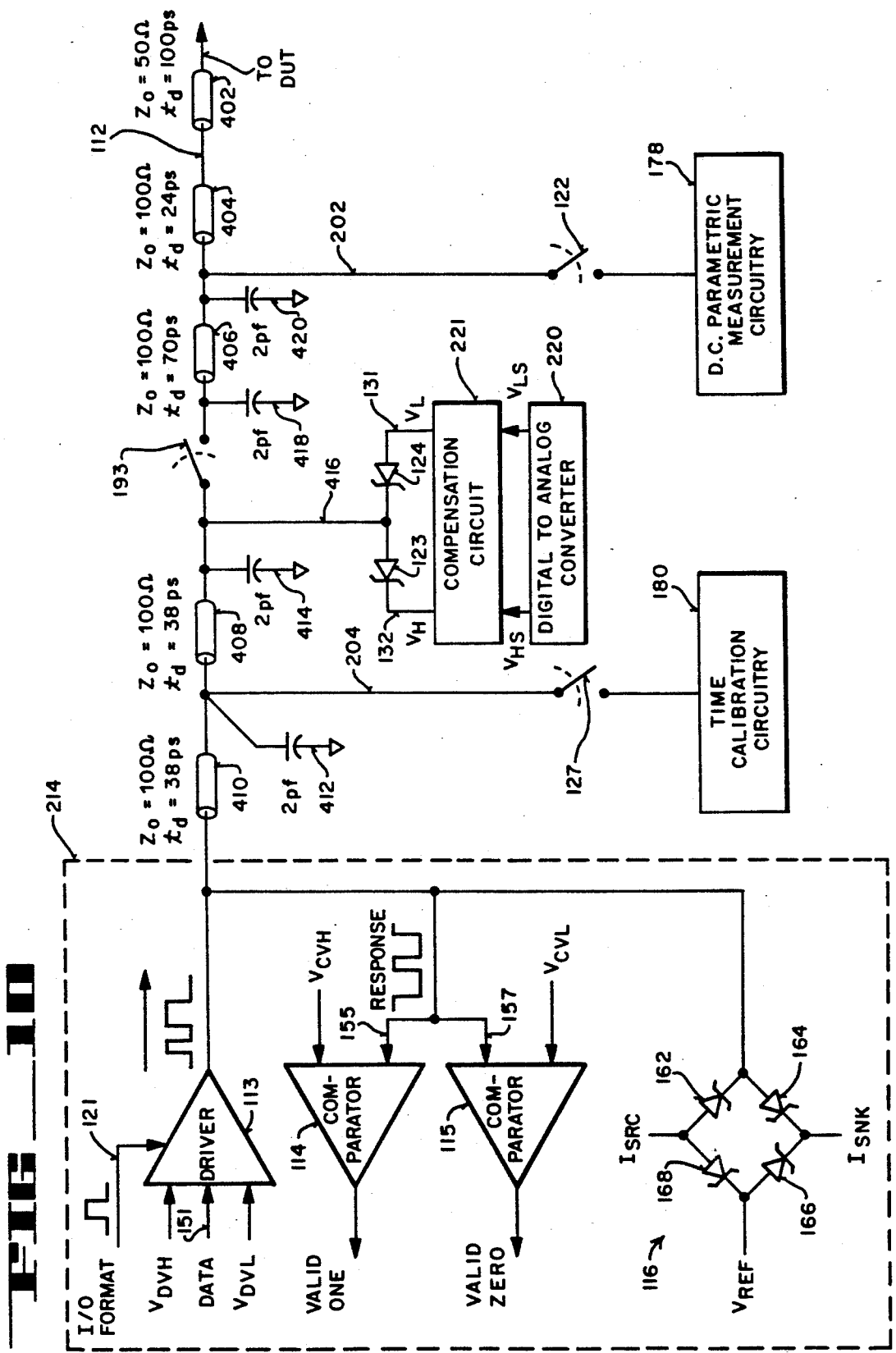
FIG.—10

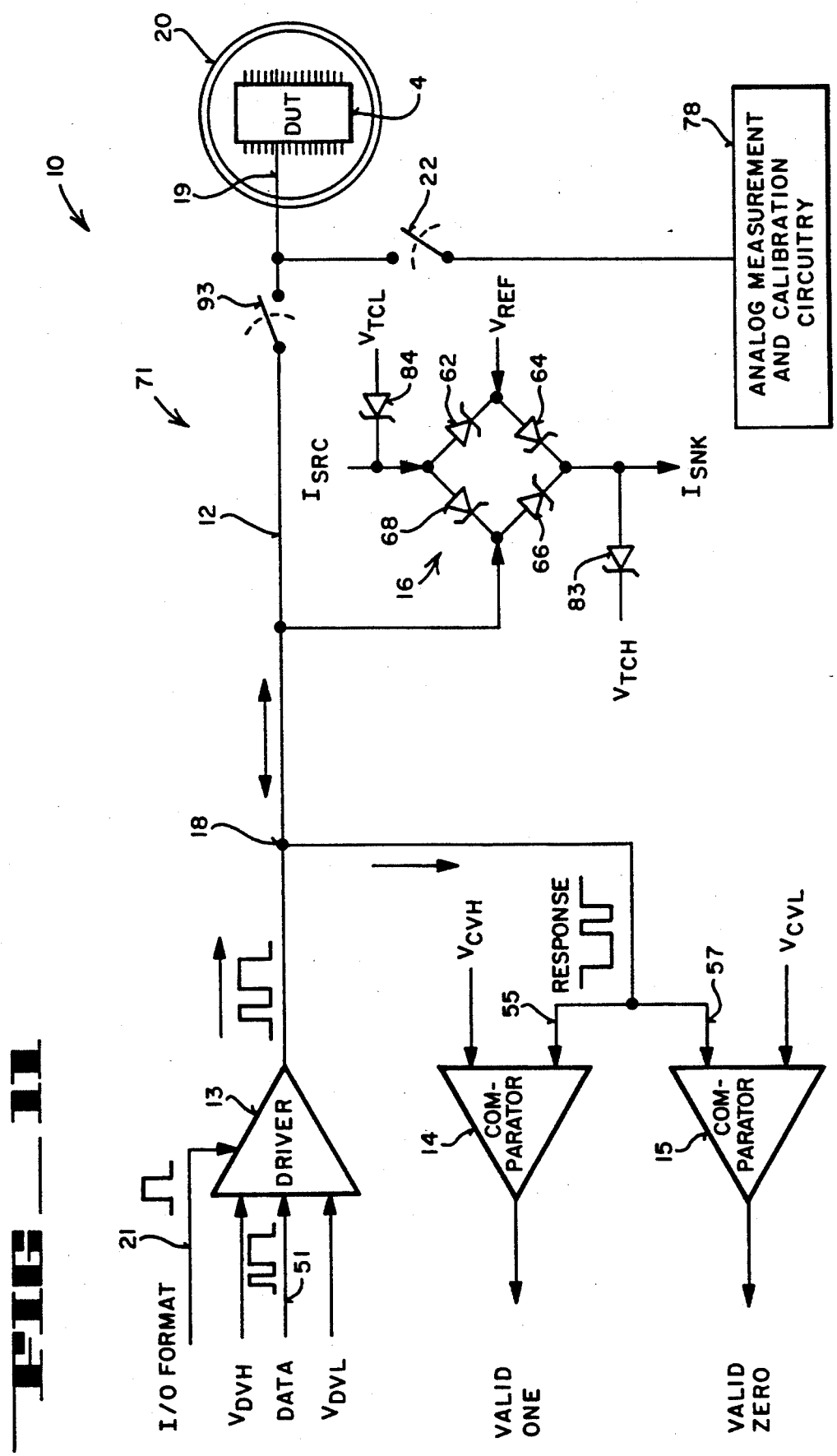
FIG_11

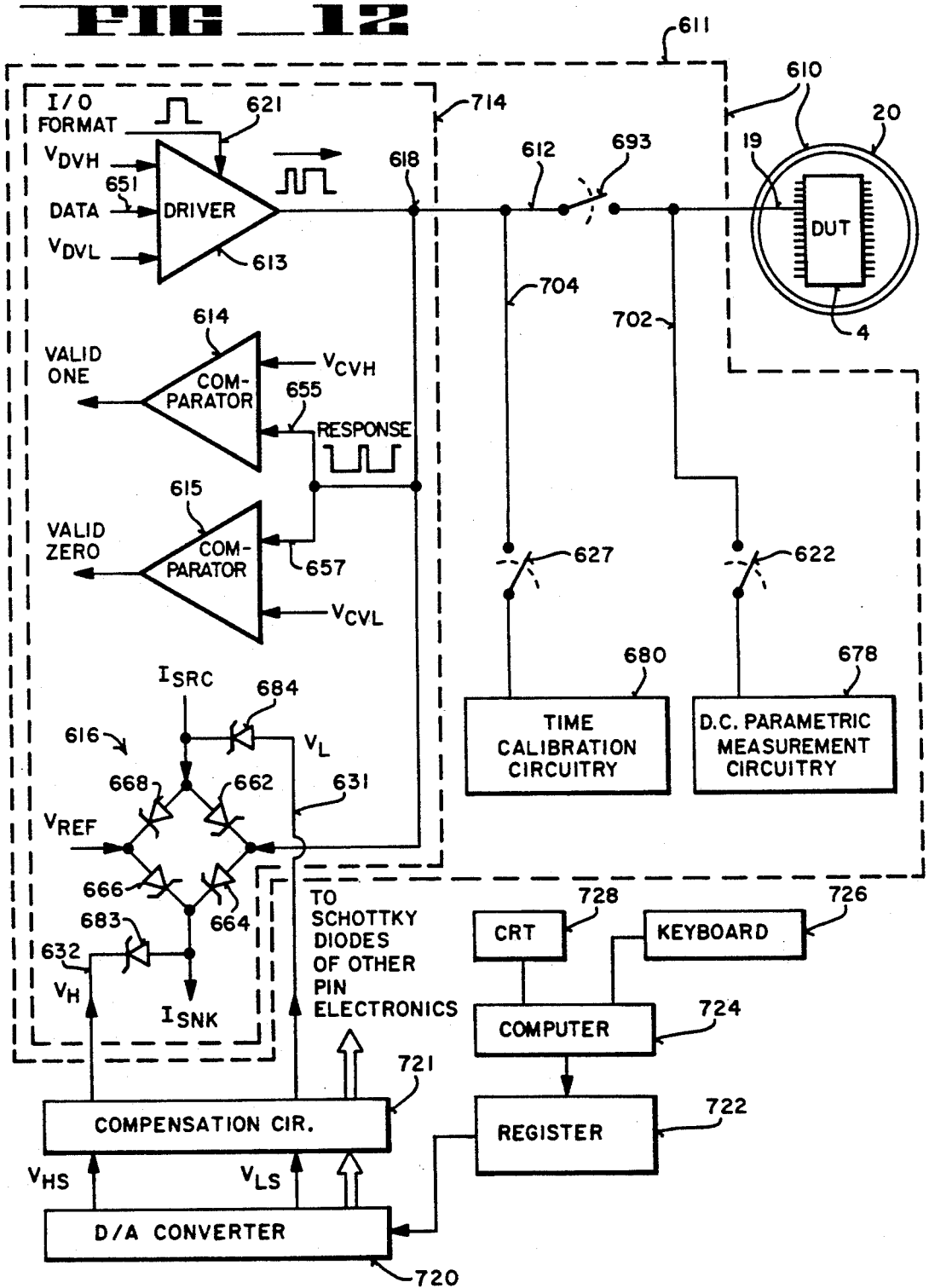
FIG_12

TEST SYSTEM APPARATUS WITH SCHOTTKY DIODES WITH PROGRAMMABLE VOLTAGES

This is a continuation-in-part of U.S. patent application Ser. No. 07/581,514, filed Sep. 10, 1990, now abandoned.

FIELD OF THE INVENTION

The present invention relates to the field of integrated circuit testing. More particularly, the present invention pertains to an apparatus for a test system for testing an electronic circuit, wherein the apparatus includes Schottky diodes with programmable voltages for reducing ringing of a signal from the electronic circuit under test.

BACKGROUND OF THE INVENTION

Integrated circuits after being fabricated and packaged are typically tested on certain types of prior art automatic test equipment ("ATE") before being shipped to customers. Devices not passing certain tests are typically discarded and not shipped. One type of ATE system includes a test head that includes a socket that holds a device under test ("DUT"). The ATE can also be used to simply learn the characteristics of the particular DUT.

FIG. 1 illustrates the pin electronics 1 and DUT socket 6 of a test head of one prior art ATE. Circuitry identical to pin electronics 1 is included for each pin of DUT 4 plugged into socket 6. Pin electronics 1 is used to transfer signals between the rest of the ATE and pin 8 of DUT 4.

Pin electronics 1 includes a driver 7 for sending signals to pin 8 of DUT 4 over interconnect path 5. Pin electronics 1 also includes a valid logic low comparator 3 and a valid logic high comparator 2 coupled to path 5 for receiving signals from DUT 4. Comparator 2 is coupled to a reference high voltage, also referred to as a preset high voltage. Comparator 3 is coupled to a reference low voltage, also referred to as a preset low voltage. Comparators 2 and 3 allow the ATE to sense whether pin 8 of DUT 4 is providing a valid logic high and a valid logic low signal, respectively.

Interconnect path 5 acts like a bidirectional transmission line with a characteristic impedance Zo.

One prior art DUT 4 is a high-speed complementary metal oxide semiconductor ("CMOS") integrated circuit ("IC"). The rise and fall times of the outputs of the CMOS DUT 4 are typically less than or equal to the time it takes the output signals of CMOS DUT 4 to travel from a pin of DUT 4 to comparators 2 and 3. In addition, the effective output impedance of the CMOS DUT 4 is typically much lower than the impedance Zo of interconnect path 5. Furthermore, the impedance of driver 7 in an off state is quite high and the impedances of the inputs of comparators 2 and 3 are also quite high.

The above-mentioned timing and impedance characteristics associated with CMOS DUT 4 and pin electronics 1 contribute to the observed result that an output voltage transition on pin 8 of a CMOS DUT 4 connected to pin electronics 1 results in multiple reflections on interconnect path 5 between the output pin of DUT 4 and (1) driver 7 and (2) comparators 2 and 3. These multiple reflections are referred to as ringing on interconnect path 5, or simply as ringing.

FIG. 2 is a Shmoo plot of one example of what ringing on interconnect path 5 might look like. FIG. 2 shows a plot 47 of what the voltage measured at low comparator 3 (or high comparator 2) versus time might look like when there is a high to low voltage transition on pin 8 of DUT 4. Plot 47 illustrates what the multiple reflections that comprise ringing might look like.

Ringing can result in inaccurate readings by the ATE of the timing and output voltage characteristics of DUT 4. For example, if comparators 2 and 3 of FIG. 1 are strobed while ringing is occurring on interconnect path 5, the voltage sensed by comparators 2 and 3 might not be the true quiescent output voltage of pin 8 of DUT 4. The ringing on interconnect path 5 may raise (or lower) the voltage seen by comparators 2 and 3 relative to the true output voltage of pin 8 of DUT 4. The ATE could accordingly erroneously conclude, for example, that DUT 4 is a defective device, even though in reality DUT 4 is not defective.

FIG. 3 illustrates pin electronics 40 and DUT socket 6 of another typical prior art ATE. Circuitry identical to pin electronics 40 is included for each pin of DUT 4 plugged into socket 6.

Pin electronics 40 includes an interconnect path 29 between DUT socket 6 and driver 7, comparators 2 and 3, and diode bridge 30. Diode bridge circuit 30 includes diodes 33 through 36. Bridge circuit 30 acts as a load circuit for interconnect path 29. Bridge circuit 30 includes a current source input $I_{SCR}$, a current sink output $I_{SNK}$, and a reference voltage terminal $V_{REF}$.

Pin electronics 40 includes DC parametric measurement circuitry 44 coupled to interconnect path 29 via line 32 and switch 48. Pin electronics 40 also includes time calibration circuitry 42 coupled to interconnect path 29 via line 31 and switch 49.

Pin electronics 40 also includes switch 46 that can be used to disconnect driver 7, comparators 2 and 3, and diode bridge 30 from DUT 4.

Pin electronics 40 includes clamping diodes 41 and 42 to provide protection against overvoltages and undervoltages. Diode 41 is coupled to voltage $V_{MAX}$, which is the maximum voltage that the pin electronics can sustain without being damaged. Diode 43 is coupled to voltage $V_{MIN}$, which is the minimum voltage that the pin electronics can sustain without being damaged. $V_{MAX}$ is typically approximately two volts greater than the driver 7 maximum voltage $V_{DVH}$ and typically approximately two volts less than the driver 7 minimum voltage $V_{DVL}$. Therefore, diodes 41 and 43 are typically reverse biased with driver 7 operating within its limits of $V_{DVH}$ to $V_{DVL}$.

For prior art pin electronics 40, impedance matching is performed with respect to interconnect path 29 and DUT 4. On the circuit board containing pin electronics 40, pad sizes and lead lengths are adjusted so that there is impedance matching. Typically, interconnect path 29 is comprised of segments that give an equivalent overall impedance of 50 ohms over a large bandwidth approaching one gigahertz.

Although for prior art pin electronics 40 the location of clamping diodes 41 and 43 is not crucial, for one prior art ATE, clamping diodes 41 and 43 are nevertheless connected to interconnect path 29 at a point near to the inputs to comparators 2 and 3 and far from pin 8.

Prior pin electronics 40 also suffers the effects of ringing on interconnect path 29.

One prior approach to solving the problem of ringing is to allow a certain period of time to pass before enabling comparators 2 and 3 of FIGS. 1 and 3 with strobes. This time delay allows the ringing on interconnect paths 5 and 29 to dampen out before comparators 2 and 3 are enabled.

One disadvantage of this time delay approach is that it typically delays the time at which comparators 2 and 3 can be sampled, which sometimes prevents the testing of certain output states of DUT 4 at the specified time of the test specification for DUT 4. The time period of significant ringing to dampen to about 20% can typically range from (1) about 15 transit times (through interconnect paths 5 or 29) when the DUT 4 output impedance is approximately 10 ohms and the impedance of interconnect path 5 or 29 is about 50 ohms to (2) about five transit times (through interconnect paths 5 or 29) when the DUT 4 output impedance is about 30 ohms and the impedance of interconnect path 5 or 29 is about 50 ohms.

Another prior approach to solving the ringing problem is to set the threshold voltages of comparators 2 and 3 outside of the range of voltages induced by ringing.

One disadvantage of this threshold voltage approach is that it sometimes prevents testing DUT 4 to the test specification with respect to certain voltage levels.

Another prior approach to solving the ringing problem is to attempt to match the output impedance of pin 8 of DUT 4 with the impedance of interconnect path 5 or 29 by adding a resistor (not shown) in series with output pin 8 of DUT 4. Interconnect path 5 or 29 is thus connected to output pin 8 of DUT 4 via the resistor.

Adding a resistor in series with pin 8 and line 5 or 29 has certain disadvantages, however. To begin with, a true output impedance match cannot always be achieved as a practical matter given that impedances vary from pin to pin and from DUT to DUT. Even if the proper series resistor is inserted, the use of that series resistor typically reduces the direct current ("DC") test accuracy given the voltage drop across the series resistor. Moreover, the series resistor typically degrades test timing accuracy given that the series resistor typically introduces additional time delay that varies and thus typically cannot be accurately adjusted for thorough calibration. Furthermore, if DUT 4 includes generic pins that perform both input and output functions, then a series resistor connected to those pins would typically degrade a signal applied by driver 7 to those generic pins. Ringing is associated with outputs from the DUT, not with inputs to the DUT. The use of a series resistor in interconnect path 5 or 29 would, however, affect input signals applied to DUT 4.

Another prior approach to solving the ringing problem is to terminate interconnect path 5 or 29 in its characteristic impedance at the driver 7 side by turning driver 7 on when comparators 2 and 3 are in operation, thereby allowing driver 7 to act as a voltage source with a resistance, for example, of 50 ohms.

One disadvantage associated with this prior approach is that when driver 7 is turned on, driver 7 can add a DC current load to the output circuit of DUT 4, depending upon the voltage that driver 7 is set to. This can sometimes cause excessive power to be dissipated in the output circuit of DUT 4, which in turn, may sometimes damage the DUT or sometimes result in inaccurate test results.

SUMMARY AND OBJECTS OF THE INVENTION

One object of the present invention is to provide an apparatus for a test system for testing various electronic circuits, wherein the apparatus helps to reduce ringing during testing of the electronic circuit.

Another object of the present invention is to provide an apparatus for testing an electronic circuit, wherein the apparatus helps to reduce ringing during testing and, at the same time, helps to avoid excess power dissipation of the electronic circuit during testing.

Another object of the present invention is to provide an apparatus for a test system for testing an electronic circuit, wherein the apparatus helps to reduce ringing without substantially reducing bandwidth.

Another object of the present invention is to reduce ringing during the testing of an electronic circuit while maintaining a coherent transmission path.

Another object of the present invention is to provide an apparatus for a test system for an electronic circuit, wherein the apparatus includes Schottky diodes with programmable voltages to reduce ringing.

An apparatus for a test system for testing an electronic circuit is described. The apparatus comprises an interconnect path, a comparator, programmable means, a first Schottky diode, and a second Schottky diode. The interconnect path has a first end and a second end. The first end of the interconnect path is coupled to the electronic circuit under test. The interconnect path transmits a signal from the electronic circuit under test to the second end of the interconnect path. The comparator is coupled to the second end of the interconnect path for receiving and comparing the signal from the electronic circuit under test with a reference voltage. The comparator has a high input impedance. The comparator provides an output signal to the test system. The programmable means provides a selectable first voltage and a selectable second voltage. A first Schottky diode is provided for reducing ringing of the signal from the electronic circuit under test. A first end of the first Schottky diode is coupled to the interconnect path at a point near the comparator. A second end of the first Schottky diode is coupled to the selectable first voltage. A second Schottky diode is provided for reducing ringing of the signal from the electronic circuit under test. A first end of the second Schottky diode is coupled to the selectable second voltage. The second end of the second Schottky diode is coupled to the interconnect path at a point near the comparator.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 6 is a Shmoo plot of one example of what a voltage measured at a comparator of the pin electronics might look like;

FIG. 7 shows a layout of a portion of one side of a pin electronics circuit board;

FIG. 8 shows a layout of a portion of another side of the pin electronics circuit board;

FIG. 9 shows a side view of a portion of the pin electronics circuit board;

FIG. 10 is a circuit diagram showing the transmission line and capacitive equivalent circuit model of a portion of the pin electronics;

FIG. 11 is a schematic of pin electronics of an automatic testing system, wherein the pin electronics include Schottky diodes coupled to a diode bridge;

FIG. 12 is a schematic of a portion of an automatic test system, wherein the automatic test system includes pin electronics that includes Schottky diodes coupled to a diode bridge, wherein the Schottky diodes have programmable voltage inputs.

DETAILED DESCRIPTION

Figure 4:
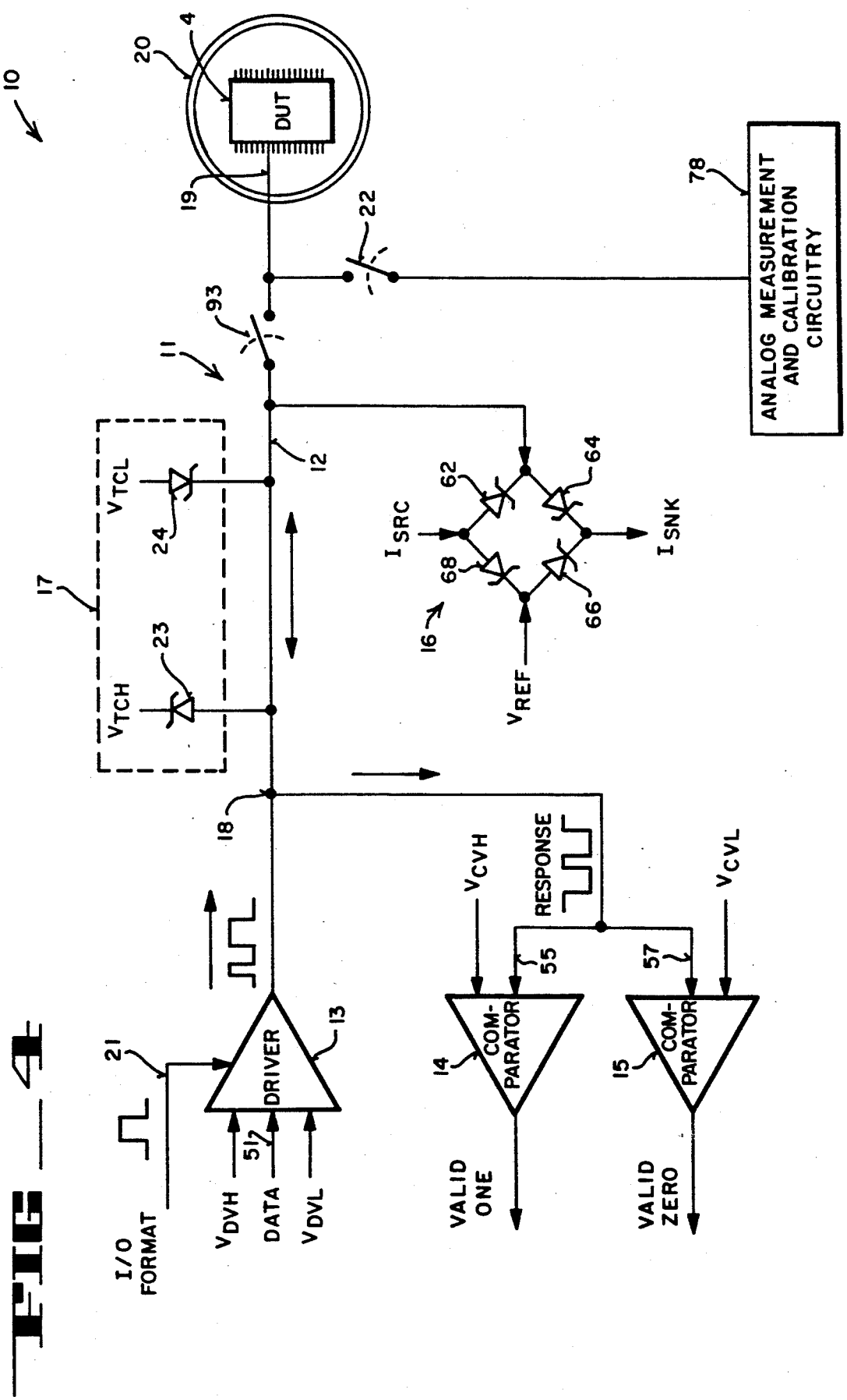
FIG. 4 is a schematic of pin electronics of an automatic testing system, wherein the pin electronics includes Schottky diodes coupled to an interconnect path.

FIG. 4 illustrates pin electronics 11 of a test head 10 of an ATE system. Device under test 4 (also referred to as DUT 4) is plugged into socket 20 of test head 10 of the ATE. In one embodiment, DUT 4 is a packaged CMOS integrated circuit. In an alternative embodiment, DUT 4 is a packaged transistor-transistor logic ("TTL") integrated circuit. In other alternative embodiments, the circuitry of DUT 4 could be of any other logic family.

One pin 19 of DUT 4 is coupled to pin electronics 11 shown in FIG. 4. Test head 10 includes other sets of pin electronics (not shown) for the other pins of DUT 4. Each of those other sets of pin electronics are comprised of the same circuitry as pin electronics 11 of FIG. 4. The pin electronics for test head 10, including pin electronics 11, reside on circuit boards that are part of test head 10. In one embodiment, there are four sets of pin electronics per circuit board.

Pin electronics 11 includes Schottky diode circuitry 17, which is described in more detail below.

The ATE system used to test DUT 4 is coupled to pin 19 of DUT 4 using pin electronics 11. Pin electronics 11 can receive output signals from DUT 4. Pin electronics 11 can also apply input signals to DUT 4.

Pin electronics 11 includes driver 13, logic high comparator 14, logic low comparator 15, diode clamps 23 and 24, interconnect path 12, diode bridge 16, analog measurement and calibration circuitry 78, and switches 22 and 93. Interconnect path 12 couples pin 19 of DUT 4 to (1) driver 13, (2) comparators 14 and 15, and (3) diode bridge 16. Driver 13 and comparators 14 and 15 are in turn coupled to other circuitry (not shown) of the ATE system.

Interconnect path 12 has the characteristics of and acts like a bidirectional transmission line with a characteristic impedance of Zo. In one embodiment, impedance Zo is approximately 50 ohms.

Switch 93 can disconnect pin electronics 11 from pin 19 of DUT 4. For the embodiments discussed below, switch 93 is closed and pin electronics 11 is coupled to pin 19.

Driver 13 applies input signals to pin 19 of DUT 4 via interconnect path 12. Driver 13 is enabled and disabled by the ATE system. In one embodiment, the ATE system enables driver 13 when pin 19 of DUT 4 is either an input pin or an input/output pin ready to receive an input. In that embodiment, the ATE system disables driver 13 when pin 19 of DUT 4 is either an output pin or an input/output pin that is not ready to receive an input.

Two reference voltages $V_{DVH}$ and $V_{DVL}$ are applied as inputs to driver 13. Voltage $V_{DVH}$ is the "driver voltage high" reference voltage. Voltage $V_{DVL}$ is the "driver voltage low" reference voltage. The function of the voltages $V_{DVH}$ and $V_{DVL}$ is to standardize the voltage levels applied to pin 19 of DUT 4 so that more accurate test results can be achieved when testing DUT 4.

The ATE system can enable driver 13 by sending on I/O format high signal on line 21 to driver 13. The ATE system can disable driver 13 by sending an I/O format low signal on line 21 to driver 13. When the I/O signal is high, driver 13 provides either reference voltage $V_{DVH}$ or $V_{DVL}$ as an output, depending upon the voltage level of the data on line 51. The data on line 21 is supplied by the ATE system. In one embodiment, if the I/O format signal is logically high and the data on line 51 is logically high, then driver 13 outputs $V_{DVH}$ on interconnect path 12. If, on the other hand, the I/O format signal is logically high and the data on line 51 is logically low, then driver 13 outputs $V_{DVH}$ on interconnect path 12.

If the ATE system sends a logical low I/O format signal to driver 13 on line 21, then driver 13 is disabled. Once driver 13 is disabled, the output side of driver 13 goes into a high impedance state. As a result, node 18 of interconnect path 12 sees a high impedance state in the direction of driver 13.

The signal on pin 19 of DUT 4 and on interconnect path 12 is provided as an input 55 to comparator 14 and as an input 57 to comparator 15.

Comparator 14 is a valid one (i.e., logic high) comparator and comparator 15 is a valid zero (i.e., logic low) comparator. A comparison logical high voltage $V_{CVH}$ is applied as an input to comparator 14 and a comparison logical low voltage $V_{CVL}$ is applied as an input to comparator 15.

When an output signal received from pin 19 of DUT 4 is greater than $V_{CVH}$, then comparator 14 outputs a logical signal that indicates a valid one. When, on the other hand, the output signal received from pin 19 is less than $V_{CVH}$, then comparator 14 outputs a logical signal that indicates that the output signal received from pin 19 of DUT 4 is not a valid one.

When an output signal received from pin 19 of DUT 4 is less than $V_{CVL}$, then comparator 15 outputs a logical signal that indicates a valid zero. When, on the other hand, the output signal received from pin 19 is less than $V_{CVH}$, then comparator 15 outputs a logical signal that indicates that the output signal received from pin 19 of DUT 4 is not a valid zero.

The outputs of comparators 14 and 15 are coupled to other circuitry of the ATE system. The ATE system reads those outputs of comparator 14 to decide if the outputs of DUT 4 meet or do not meet the specifications for DUT 4. The ATE system can then judge whether or not DUT 4 is defective. Alternatively, the ATE system can use the outputs comparators 14 and 15 to learn the characteristics of DUT 4.

The valid one and valid zero signals of comparators 14 and 15, respectively, are generally only meaningful, however, when DUT 4 is outputting a signal via pin 19 and pin 19 is either an output pin or an input/output pin. In one embodiment, the ATE system disables driver 13 (by placing a logical low I/O format signal on line 21) before pin 19 of DUT 4 outputs a signal.

Comparators 14 and 15 each has a relatively high input impedance. Thus, the impedances at input connections 55 and 57 are very high.

Pin electronics 11 also includes diode bridge circuit 16 coupled to interconnect path 12. Diode bridge circuit 16 includes diodes 62, 64, 66, and 68. Bridge circuit 16 acts as a load circuit for interconnect path 12. Bridge circuit 16 includes a current source input $I_{SCR}$, a current sink output $I_{SNK}$, and a reference voltage terminal $V_{REF}$. Diode bridge circuit 16 is adapted for testing TTL devices as the devices under test. Diode bridge circuit 16 operates as a current sink when pin 19 of DUT 4 is at high voltage and as a current source when pin 19 of DUT 4 is at low voltage.

Pin electronics 11 additionally includes analog measurement and calibration circuitry 78. Circuitry 78 includes various analog measurement and calibration circuitry for parametric measurement of DUT 4 and for the self-testing and calibration of pin electronics 11.

In one embodiment, pin electronics 11 includes clipping circuitry 17. Clipping circuit 17 clips undervoltages and overvoltages on interconnect path 12 based on a set of predetermined reference voltages $V_{TCH}$ and $V_{TCL}$. $V_{TCH}$ is the termination clipping high voltage. $V_{TCL}$ is the termination clipping low voltage. In one embodiment with a CMOS DUT 4, $V_{TCH}$ is set to approximately Vcc minus one voltage drop. $V_{TCL}$ is set to approximately Vss plus one diode voltage drop. In alternative embodiments, however, the $V_{TCH}$ and $V_{TCL}$ voltages can be preset to higher or lower voltage levels.

As shown in FIG. 4, clipping circuit 17 includes Schottky diodes 23 and 24. Schottky diodes 23 and 24 have relatively fast switching speeds. In addition, Schottky diodes 23 and 24 have relatively low impedances when turned on.

In an alternative embodiment, Schottky diodes 23 and 24 can be replaced by other types of high speed diodes. In yet another alternative embodiment, diodes 23 and 24 can be replaced by high speed transistors with relatively high switching speeds and relatively low impedances when turned on.

In one embodiment, the cathode of diode 23 is coupled to the termination clipping high voltage $V_{TCH}$, and the anode of diode 23 is coupled to interconnect path 12. The anode of diode 24 is coupled to the termination clipping low voltage $V_{TCL}$, and the cathode of diode 24 is coupled to interconnect path 12.

The impedance of comparator node 18 seen from interconnect path 12 is equal to an open circuit impedance when driver 13 is off (i.e., disabled). In other words, the characteristic impedance Zo of interconnect path 12 is in effect not terminated at comparator node 18.

When an output signal on pin 19 of DUT 4 rises from a low voltage to a high voltage (i.e., from a logical zero state to a logical one state), the voltage rise triggered by pin 19 and incident on comparator node 18 is bounced back (i.e., reflected) from comparator node 18 towards pin 19. This reflection causes the incident and reflected voltages on interconnect path 12 to add together.

Figure 1:
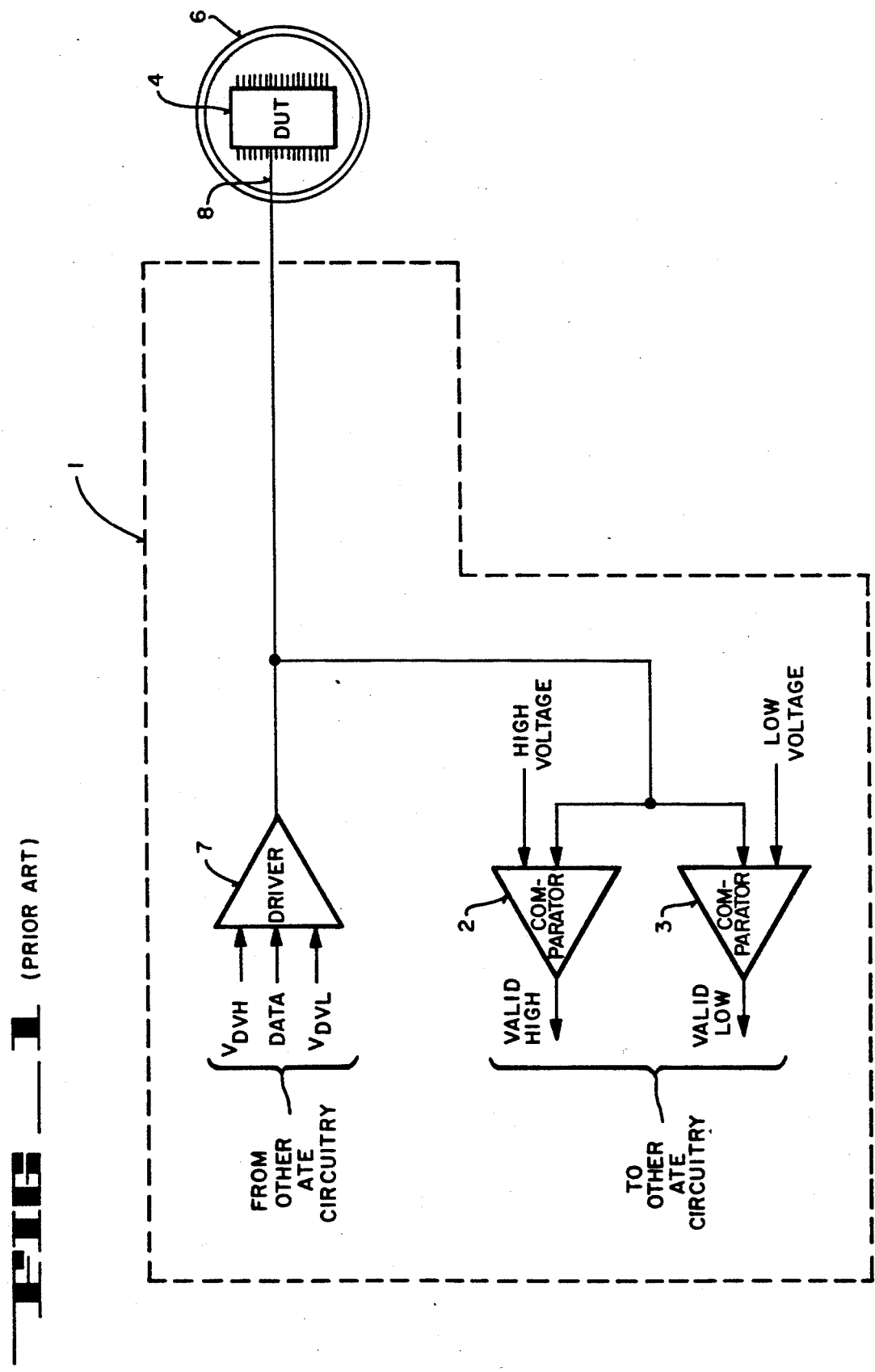
FIG. 1 is a schematic of pin electronics of one prior art automatic testing system.
Figure 2:
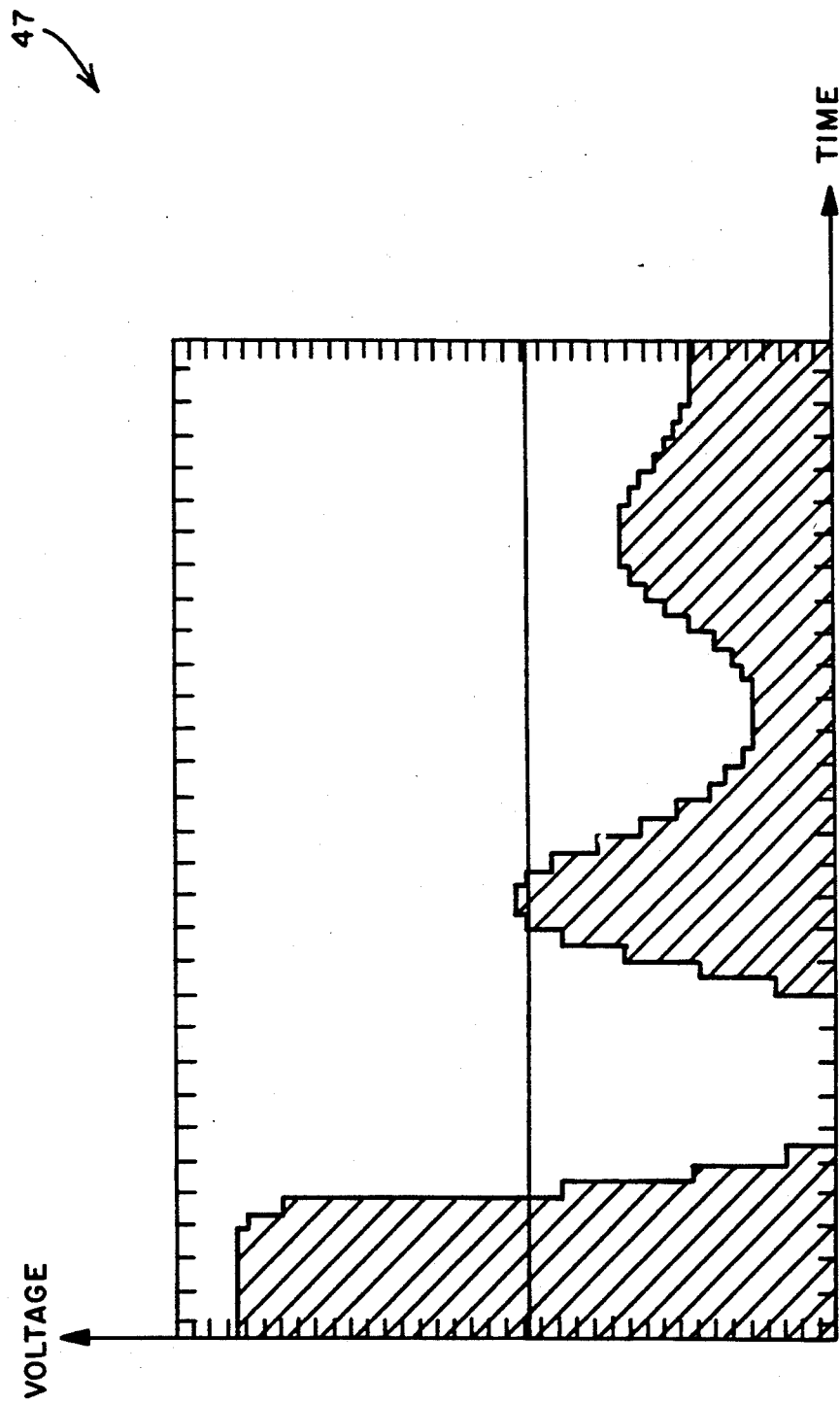
FIG. 2 is a Shmoo plot of one prior art example of what ringing might look like as measured at a comparator.
Figure 3:
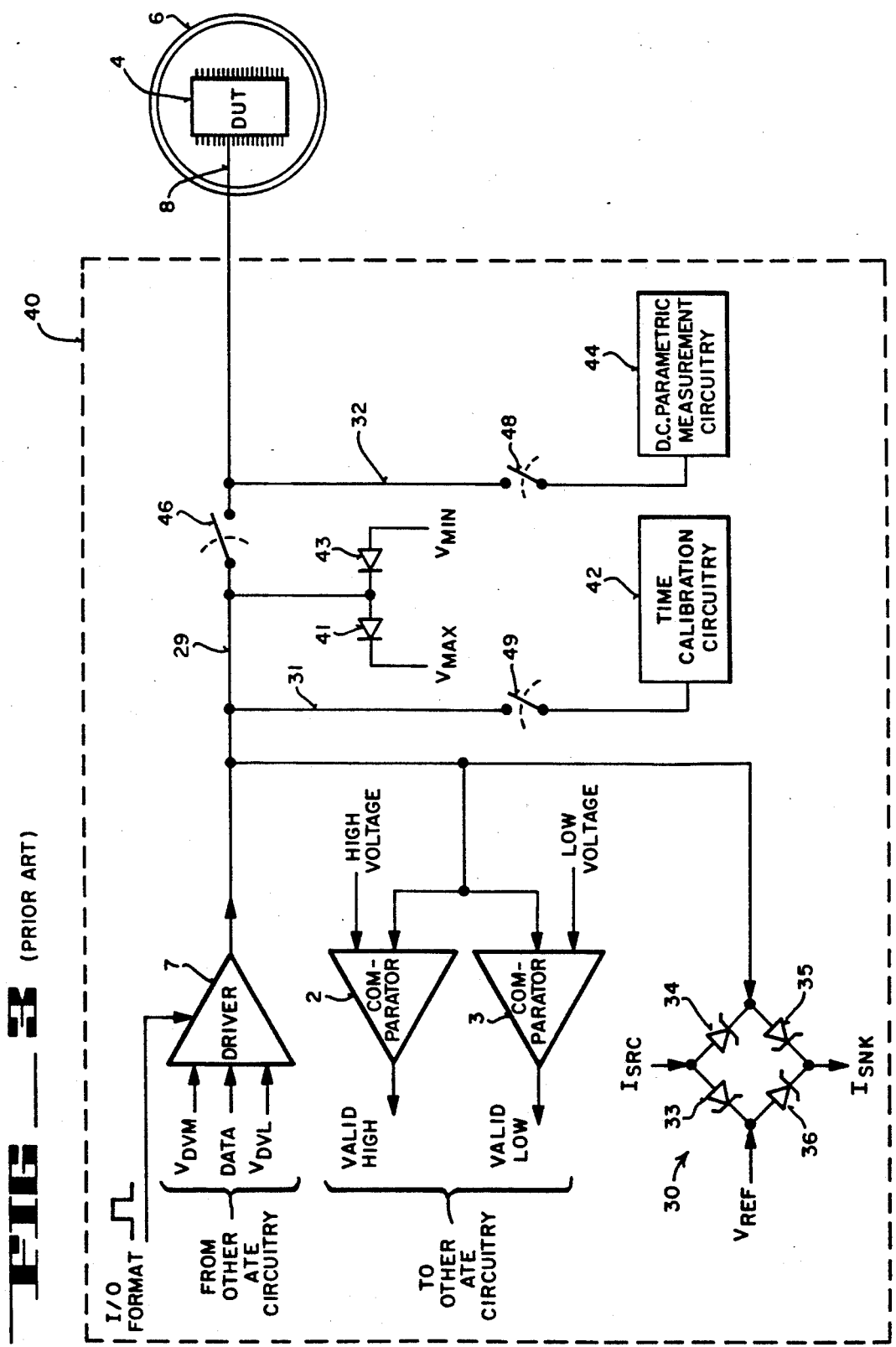
FIG. 3 is a schematic of pin electronics of another prior art automatic testing system.

If clipping diode circuitry 17 were not connected to pin electronics 11 of FIG. 2, then the amplitude of the reflected voltage would initially typically be double the voltage outputted by pin 19 of DUT 4. This large reflected voltage would typically therefore initially trigger incorrect or false readings by comparators 14 and 15 because this large reflected voltage at node 18 would be applied as an input to comparators 14 and 15.

In one embodiment, however, clipping circuit 17 is coupled to interconnect path 12. In one embodiment, termination clipping high voltage $V_{TCH}$ is set to approximately Vcc minus one diode voltage drop. Vcc is the supply voltage of DUT 4 (for a CMOS DUT). The logical high operating voltage appearing at line 19 of a CMOS DUT 4 is typically less than Vcc but close to Vcc. As the reflected voltage on interconnect path 12 begins to exceed approximately Vcc, Schottky diode 23 quickly becomes forward biased. Once diode 23 becomes forward biased, the voltage on interconnect path 12 becomes clipper or held to the voltage Vcc, which is equal to approximately $V_{TCH}$ plus the voltage drop of diode 23. During this period, diode 24 is reverse biased by the reflected voltage and remains in an off condition.

Given that the reflected voltage turns on diode 23, diode 23 helps to prevent (1) a large voltage reflection back to pin 19 of DUT 4 and (2) a large voltage increase at node 18 induced by reflection. With the initial reflected voltage greatly reduced, the ringing resulting from the transition of the low voltage to the high voltage is also greatly reduced.

If clipping circuitry 17 were disconnected from interconnect path 12, then when an output signal dropped from a logical high state (i.e., a high voltage state) to a logical low state (i.e., a low voltage state), the decrease in amplitude of the voltage at node 18 of interconnect path 12 would be additive due to reflection. The reflection would initially typically cause a doubling of the decrease in voltage at node 18 over the true voltage decrease at pin 19.

In one embodiment, however, clipping circuitry 17 is coupled to interconnect path 12. In one embodiment, termination clipping low voltage $V_{TCL}$ is set to approximately Vss plus one diode voltage drop. In one embodiment, Vss is ground. The logical low operating voltage appearing at pin 19 of a CMOS DUT 4 is typically greater than Vss but close to Vss. As the reflected voltage on interconnect path 12 begins to go below approximately Vss, diode 24 quickly becomes forward biased. Once diode 24 becomes forward biased, the voltage on interconnect path 12 becomes clipped or held to voltage Vss, which is equal to approximately $V_{TCL}$ minus the voltage drop of diode 24. During this period, diode 23 is reverse-biased by the reflected voltage and remains in an off condition.

Given that the reflected voltage turns on diode 24, diode 24 helps to prevent (1) a large voltage reflection back to pin 19 of DUT 4 and (2) a large voltage decrease at node 18 induced by reflection. With the initial reflected voltage greatly reduced, the ringing resulting from the transition of the high voltage to the low voltage is also greatly reduced.

In one embodiment, a clipping circuit identical to clipping circuit 17 comprises part of each pin electronics of test head 10.

Given that diodes 23 and 24 each contain their respective equivalent capacitance, the incorporation of clipping diodes 23 and 24 introduces that capacitance to interconnect path 12. The capacitance of diodes 23 and 24 affects the characteristic impedance Zo of interconnect path 12 when diodes 23 and 24 are connected to interconnect path 12.

The impedance Zo of interconnect path 12 satisfies the following equation:

$$Z_0 = \sqrt{L/C}$$

wherein L is the inductance of interconnect path 12 and C is the effective capacitance of interconnect path 12.

The line impedance should be controlled to approximately realize the characteristic impedance Zo at every segment of interconnect path 12. Changes in the impedance Zo of interconnect path 12 when diodes 23 and 24 are connected to interconnect path 12 should be minimized. When I/O format signal 21 enables driver 13 to drive pin 19 of DUT 4, the impedance Zo of interconnect path 12 should be close to that of driver 13. If the introduction of diodes 23 and 24 alters the impedance Zo, the transmitted signal might be distorted, which in turn might cause inaccurate test results.

Schottky diodes 23 and 24 are physically coupled to interconnect path 12 at a point near node 18 and far from pin 19 of DUT 4.

Figure 5:
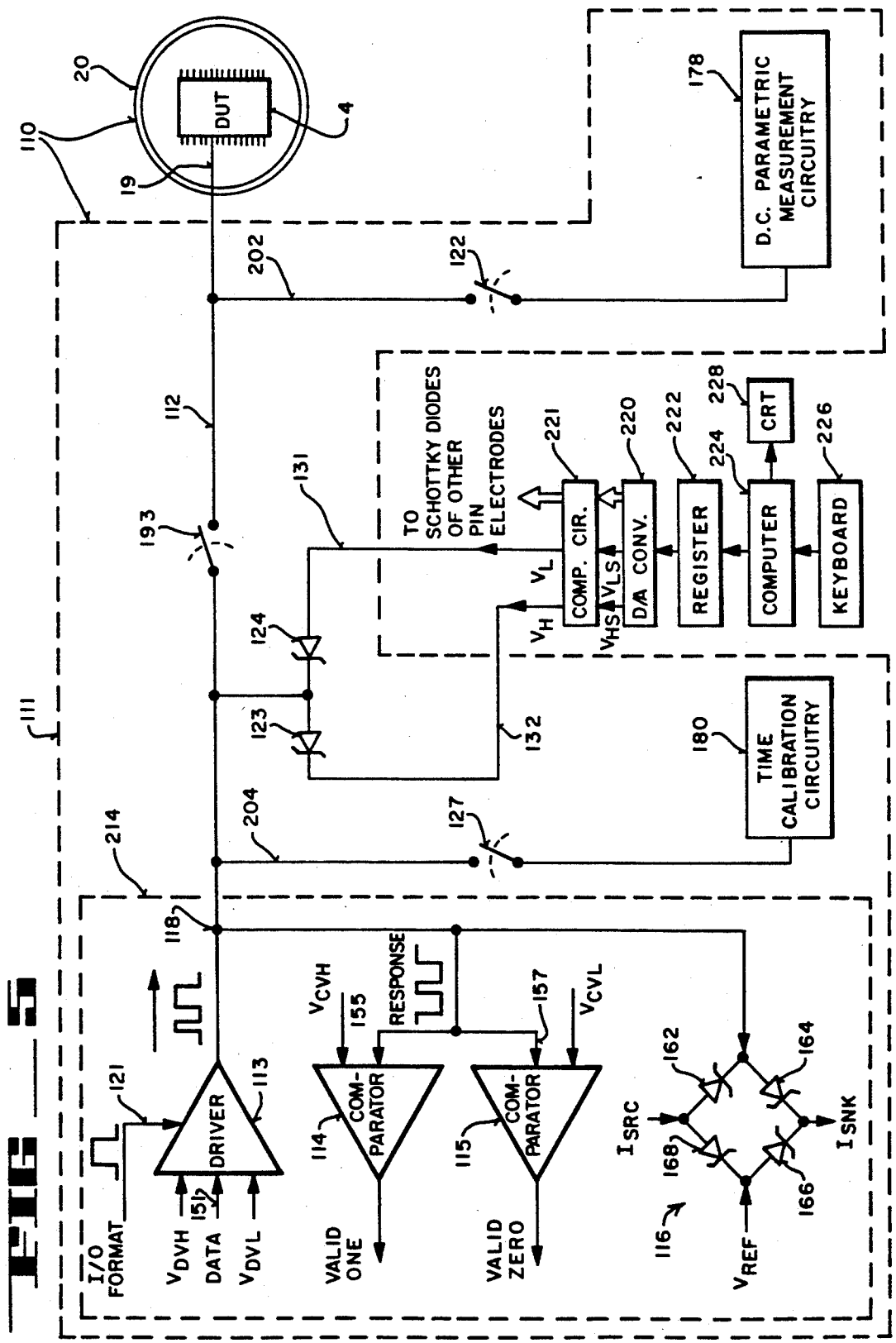
FIG. 5 is a schematic of a portion of an automatic test system, wherein the automatic test system includes pin electronics with Schottky diodes with programmable voltage inputs.

FIG. 5 shows pin electronics 111 of a test head 110 of an automatic test equipment system. Device under test 4 is plugged into socket 20 of test head 110.

One pin 19 of DUT 4 is coupled to pin electronics 111 shown in FIG. 5. Test head 110 also includes other sets of pin electronics (not shown) for the other pins of DUT 4. Each of those other sets of pin electronics have the same circuitry as pin electronics of 111 of FIG. 5. The pin electronics for test head 110, including pin electronics 111, reside on circuit boards that are part of test head 110. In one embodiment, there are four sets of pin electronics per circuit board. FIGS. 7, 8 and 9 show portion 370 of one such circuit board.

Pin electronics 111 of FIG. 5 can receive output signals from DUT 4. Pin electronics 111 can also apply input signals to DUT 4.

Pin electronics 111 includes driver 113, logic high comparator 114, logic low comparator 115, Schottky diodes 123 and 124, interconnect path 112, diode bridge 116, D.C. parametric measurement circuitry 178, time calibration circuitry 180, and switches 122, 193, and 127. Hybrid integrated circuit 214 ("IC") is also part of pin electronics 111. Hybrid IC 214 includes driver 113, comparator 114, comparator 115, and diode bridge 116.

Interconnect path 112 couples pin 19 of DUT 4 to (1) driver 113, (2) comparators 114 and 115, and (3) diode bridge 116. Driver 113 and comparators 114 and 115 are in turn coupled to other circuitry (not shown) of the ATE system.

The ATE system also includes a computer 224, a keyboard 226, and a cathode ray tube ("CRT") 228. Computer 224 is coupled to register 222. Register 222 is in turn coupled to digital to analog converter 220. Digital to analog converter 220 is coupled to compensation circuit 221. Digital to analog converter 220 sends both a high voltage $V_{HS}$ and a low voltage $V_{LS}$ to compensation circuit 221. Compensation circuit 221 is comprised of operational amplifier and diode circuitry.

Compensation circuit 221 sends a high voltage $V_H$ to Schottky diode 223 via line 132. Compensation circuit 221 sends a low voltage $V_L$ to Schottky diode 124 via line 131. Voltage $V_H$ is equal to voltage $V_{HS}$ minus one diode voltage drop. Voltage $V_L$ is equal to voltage $V_{LS}$ plus one diode voltage drop.

Interconnect path 112 has the characteristics of and acts like a bidirectional transmission line with a characteristic impedance of $Z_0$. In one embodiment of the present invention, impedance $Z_0$ is approximately 50 ohms.

Switch 193 can disconnect pin electronics 111 from pin 19 of DUT 4. In one embodiment, switch 193 is a reed relay. For the embodiment discussed below, switch 193 is closed and pin electronics 111 is coupled to pin 19.

As stated above, hybrid IC 214 includes driver 112, comparators 114 and 115, and bridge 116.

Driver 113 applies input signals to pin 19 of DUT 4 via interconnect path 112. Two reference voltages $V_{DVH}$ and $V_{DVL}$ are applied as inputs to driver 113. The ATE system can enable driver 113 by sending an I/O format high signal on line 121 to driver 113. The ATE system can disable driver 113 by sending an I/O format low signal on line 121 to driver 113. When driver 113 is disabled, the output side of driver 113 goes into a high impedance state.

The signal on pin 19 of DUT 4 and on interconnect path 112 is provided as an input 155 to comparator 114 and as an input 157 to comparator 115. Comparator 114 is a valid one (i.e., logic high) comparator and comparator 15 is a valid zero (i.e., logic low) comparator. A comparison logical high voltage $V_{CVH}$ is applied as an input to comparator 14 and a comparison logical low voltage $V_{CVL}$ is applied as an input to comparator 115. The outputs of comparators 114 and 115 are coupled to other circuitry of the ATE system.

The valid one and valid zero signals of comparators 114 and 115, respectively, are generally only meaningful when (1) DUT 4 is outputting a signal via pin 19 and (2) pin 19 is either an output pin or an input/output pin. In one embodiment, the ATE system disables driver 113 (by placing a logical low I/O format signal on line 121) before pin 19 of DUT 4 outputs a signal.

Comparators 114 and 115 each has a relatively high input impedance. Thus the impedances at input connections 155 and 157 and at node 118 are very high.

Diode bridge circuit 116, which is part of hybrid IC 214, is coupled to interconnect path 112. Diode bridge circuit 116 includes diodes 162, 164, 166, and 168. Bridge circuit 116 acts as a load circuit for interconnect path 112. Bridge circuit 116 is coupled to a current source input $I_{SCR}$, a current sink output $I_{SNK}$, and a reference voltage $V_{REF}$. Diode bridge circuit 116 is adapted for testing a TTL device as the device under test. Diode bridge circuit 116 operates as a current sink when pin 19 of DUT 4 is at a high voltage and is a current source when pin 19 of DUT 4 is at a low voltage.

Pin electronics 111 includes DC parametric measurement circuitry 178 coupled to interconnect path 112 via line 202 and switch 122. In one embodiment, switch 122 is a reed relay. DC parametric measurement circuitry is engaged by closing switch 122. DC parametric measurement circuitry 178 includes analog measurement circuitry for parametric measurement of DUT 4 and for the self-testing of pin electronics 111.

Pin electronics 111 includes time calibration circuitry 180 coupled to interconnect path 112 via line 204 and switch 127. In one embodiment, switch 127 is a reed relay. Time calibration circuitry 180 includes circuitry for the calibration of pin electronics 111.

Pin electronics 111 includes Schottky diodes 123 and 124 coupled to interconnect path 112. The cathode of Schottky diode 124 is coupled to interconnect path 112.

The anode of Schottky diode 123 is coupled to interconnect path 112.

The anode of diode 124 is coupled to compensation circuit 221 via line 131. Compensation circuit 221 sends low voltage $V_L$ on line 131 to the anode of Schottky diode 124. The cathode of Schottky diode 123 is coupled to compensation circuit 221 via line 132. Compensation circuit sends a high voltage $V_H$ to cathode 123 via line 132.

Each device under test has its own operating characteristic. Typically, a logical high output voltage for a CMOS DUT 4 is less than Vcc but close to Vcc for the DUT. Moreover, the logical low output voltage for a CMOS DUT 4 is typically greater than Vss but close to Vss for the DUT.

Keyboard 226, computer 224, CRT 228, register 222, digital to analog converter 220, and compensation circuit 221 allow a user of the ATE to set the voltage levels of $V_H$ and $V_L$. In one embodiment, $V_H$ is set by the user of the ATE to a voltage higher than the logical high operating voltage of the DUT 4. A user of the ATE also sets low voltage $V_L$ to a voltage less than the actual operational low voltage of DUT 4. In one embodiment, high voltage $V_H$ is set equal to Vcc for a CMOS DUT 4 minus one diode voltage drop. Low voltage $V_L$ is set equal to ground or Vss for DUT 4 plus one diode voltage drop.

Schottky diodes 123 and 124 each has a relatively fast switching speed. In addition, Schottky diodes 123 and 124 each has a relatively low impedance when it is conducting or turned on.

In an alternative embodiment, Schottky diodes 123 and 124 can be replaced by high speed transistors having low impedances when conducting.

Schottky diodes 123 and 124 clip voltage overshoot and undershoot with respect to interconnect path 112. In particular, diode 123 clips voltage overshoot. Diode 124 clips voltage undershoot.

The clipping of voltage overshoot by Schottky diode 123 occurs when the voltage on interconnect path 112 exceeds Vcc, which is equal to $V_L$ the high voltage $V_H$ plus one diode voltage drop.

The clipping of voltage undershoot by Schottky diode 124 occurs when the voltage on interconnect path 112 goes below Vss, which is equal to minus one diode voltage drop.

When driver 113 is off (i.e., disabled), the impedance of node 118 seen from interconnect path 112 is equal to an open circuit impedance. In other words, the characteristic impedance $Z_0$ of interconnect path 112 is in effect not terminated at node 118.

When an output signal on pin 19 of DUT 4 rises from a low voltage to a high voltage (i.e., from a logical zero state to a logical one state), the voltage rise triggered by pin 19 and incident on node 118 is bounced back (i.e., reflected) from node 118 towards pin 19. This reflection causes the incident and reflected voltages on interconnect path 112 to add together.

If Schottky diode 123 were not connected to pin electronics 111 of FIG. 5, then the amplitude of the reflected voltage would initially typically be double the voltage that is provided as an output by pin 19 of DUT 4. This large reflected voltage would typically therefore initially trigger incorrect or false readings by comparators 114 and 115 because the large reflected voltage at node 118 would be applied as an input to comparators 114 and 115.

This large voltage on interconnect path 112 would continue to oscillate. The initial and subsequent voltage swings of this initial voltage on interconnect path 112 are collectively referred to as ringing on interconnect path 112.

Schottky diode 123, however, reduces the ringing on interconnect path 112 when the voltage $V_H$ is set to approximately Vcc minus one diode voltage drop. For example, as the reflected voltage on interconnect path 112 begins to exceed approximately Vcc, Schottky diode 123 quickly becomes forward biased. Once Schottky diode 123 becomes forward biased, the voltage on interconnect path 112 becomes clipped. In other words, the voltage on interconnect path 112 is then held to the voltage Vcc, which is equal to the voltage $V_H$ plus the voltage drop of diode 123. During this period, diode 124 remains in an off condition.

The point of reflection of the voltage waveform traveling down interconnect path 112 is approximately near node 118. In a preferred embodiment of the present invention, Schottky diodes 123 and 124 reside at a point close to node 118. This means that Schottky diodes 123 and 124 reside at a point near the point of reflection of the waveform on interconnect path 112.

Given that Schottky diode 123, resides near the point of reflection, the turning on of diode 123 helps to prevent (1) a large voltage reflection back to pin 19 of DUT 4 and (2) a large voltage increase at node 118 induced by reflection. With the initial reflected voltage greatly reduced, the ringing resulting from the transition of a high voltage to a low voltage is also significantly reduced.

If Schottky diode 124 were disconnected from interconnect path 112, then when an output signal dropped from a logical high state to a logical low state, the decrease in amplitude of the voltage at node 118 of interconnect path would be additive due to reflection. The reflection would initially typically cause a doubling of the decrease in voltage at node 118 over the true voltage decrease at pin 19.

Schottky diode 124, however, clips the voltage undershoot. For one embodiment, the low voltage $V_L$ coupled to Schottky diode 124 is set to the low voltage Vss of DUT 4 plus one diode voltage drop. For one embodiment, Vss is ground. As the reflected voltage on interconnect path 112 begins to go below approximately Vss, then Schottky diode 124 quickly becomes forward biased. Once diode 124 becomes forward biased, the voltage on interconnect path 112 becomes clipped. In other words, the voltage on interconnect path 112 becomes held to a voltage Vss, which is approximately equal to the voltage $V_L$ minus the voltage drop of diode 124. During this period, diode 123 remains in an off condition.

Given that diode 124 resides near the point of reflection, The turning on of diode 124 helps to prevent (1) a large voltage reflection back to pin 19 of DUT 4 and (2) a large voltage decrease at node 118 induced by reflection. With the initial reflected voltage greatly reduced, the ringing resulting from the transition of the high voltage to a low voltage is also significantly reduced.

In one embodiment, Schottky diodes identical to Schottky diodes 123 and 124 comprise part of each pin electronics of test head 110.

Figure 6:
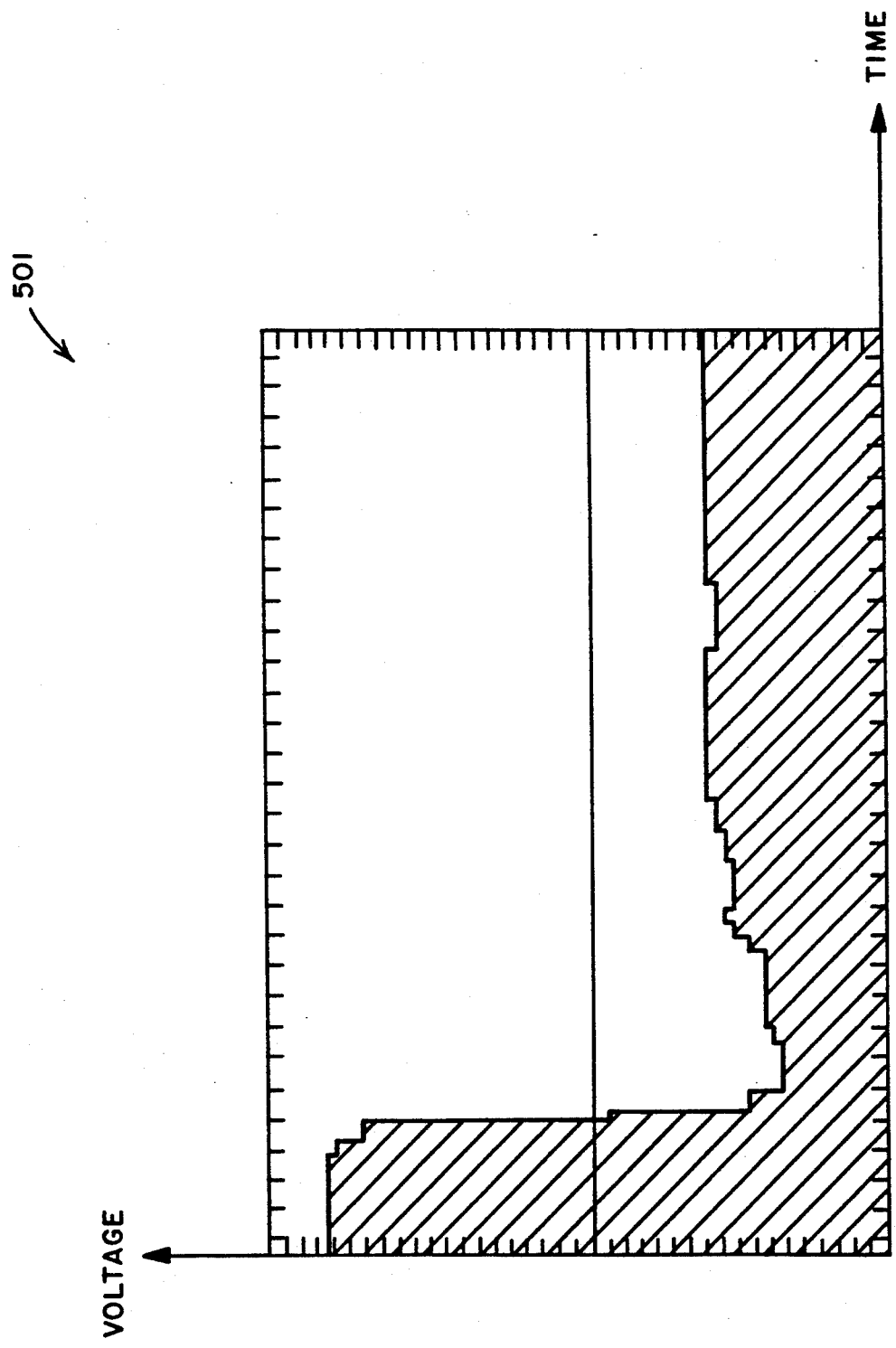

FIG. 6 illustrates an example of a voltage versus time curve 501 that might be generated for the voltage appearing at inputs 155 and 157 to comparators 114 and 115 when pin 19 of DUT 4 goes from a logical high voltage to a logical low voltage. FIG. 6 shows an example of the voltage that might result from Schottky diode 124 clipping a voltage undershoot. Clipping of this voltage undershoot would help to reduce ringing on interconnect path 112.

Returning to FIG. 5, computer 224, keyboard 226, cathode ray tube 228, register 222, digital to analog converter 200, and compensation circuit 221 allow a user of the test system to program on a per-pin basis the voltages $V_H$ and $V_L$. In other words, the voltages $V_H$ and $V_L$ for the other pin electronics of the test system can have different values.

There are pin electronics for each pin of the device under test 4. Allowing the user to program the voltages $V_H$ and $V_L$ for each of the pins of DUT 4 means that ringing can be reduced on the various interconnect paths even though DUT 4 may have different logical high and logical low voltage values for different pins. More importantly, however, the programmability of voltages $V_H$ and $V_L$ for each of the pin electronics also allows the test system to operate with reduced ringing for different types of devices under test that have different logical high and logical low voltage values. In other words, the programmability of voltages $V_H$ and $V_L$ allows for pin-to-pin variations in logical voltage levels and also for device-to-device variations in logical voltage levels.

The user of the ATE can call up the current values of $V_{HS}$ and $V_{LS}$ for the pins of the device under test 4 by operating computer 224 via keyboard 226. The current values of $V_{HS}$ and $V_{LS}$ for each pin of DUT 4 is displayed on CRT 228. The computer program running on computer 224 then asks the user whether he or she wishes to change the values of $V_{HS}$ or $V_{LS}$ for each pin of DUT 4. The user can then enter the values of $V_{HS}$ or $V_{LS}$ the user wishes to set. The user enters those values via keyboard 226 and views the results on CRT 228.

The user first might, for example, check a data sheet published for DUT 4. The data sheet might, for example, list for a CMOS DUT 4 the values of Vcc, Vss, the operational high voltage $V_{OH}$, and the operational low voltage $V_{OL}$. That data sheet might also list the typical operating characteristics for DUT 4.

Thus, the user can use computer 224, keyboard 226, and CRT 228 to program in the values of $V_{HS}$ and $V_{LS}$ the user wishes to set for each pin of DUT 4.

Computer 224 sends a digital signal to be stored in register 222 in order to set the values of $V_{HS}$ and $V_{LS}$. The digital information stored in register 222 includes the digital values of $V_{HS}$ and $V_{LS}$ for each pin of DUT 4.

Register 222 sends all the digital values of $V_{HS}$ and $V_{LS}$ for all the pin electronics to digital to analog converter 220. Digital to analog converter 220 then converts those digital values of $V_{HS}$ and $V_{LS}$ to analog voltage values.

Digital to analog converter 220 then sends all the analog voltages $V_{HS}$ and $V_{LS}$ for all the pin electronics to compensation circuit 221. Compensation circuit 221 is comprised of an operational amplifier and diodes. Compensation circuit decreases each analog voltage $V_{HS}$ (for each pin electronics) by one diode voltage drop to form each analog voltage $V_H$ for each pin electronics. Compensation circuit increases each analog voltage $V_{LS}$ (for each pin electronics) by one diode voltage drop to form each analog voltage $V_L$ for each pin electronics.

Compensation circuit 221 has outputs coupled to each of the Schottky diodes of the interconnect paths of each of the pin electronics for the test system.

As shown in FIG. 5, compensation circuit 221 has an output line 132 coupled to the cathode of Schottky diode 123. Compensation circuit 221 sends an analog voltage $V_H$ on that line. That analog voltage $V_H$ is equal to the analog value of $V_{HS}$ for pin 19 minus one diode voltage drop.

Compensation circuit 221 has an output line 131 coupled to the anode of Schottky diode 124. Compensation circuit 221 outputs a low voltage $V_L$ on line 131. That low voltage $V_L$ is equal to the analog value of $V_{LS}$ for pin 19 plus one diode voltage drop.

Compensation circuit 221 also has output lines running to all the other Schottky diodes of the other pin electronics circuitry of the test system. Those other lines contain other high $V_H$ and low $V_L$ voltages for the cathodes and anodes of the Schottky diodes coupled to the other interconnect paths of the test system. In that way, the computer 224 for the test system can be used to control the voltages going to the Schottky diodes coupled to the interconnect paths of all the pin electronics cards.

In one embodiment, there is circuitry equivalent to register 222, digital to analog converter 220, and compensation circuit 221 on each circuit board of test head 110. For that embodiment, there is a single computer 224 (plus keyboard 226 and CRT 228) for the ATE.

In an alternative embodiment, there is circuitry equivalent to register 222, digital to analog converter 220, and compensation circuit 221 for each pin electronics. In yet another alternative embodiment, there is a single register 222, a single digital to analog converter 220, and a single compensation circuit 221 for the ATE.

In an alternative embodiment, compensation circuit 221 is eliminated. Instead, digital to analog converter 220 outputs voltages $V_H$ and $V_L$. For that alternative embodiment, the user sets the values of $V_H$ and $V_L$ directly by using computer 224. For example, for that embodiment the user can on computer 224 directly sent $V_H$ equal to Vcc minus one diode voltage drop. In addition, the user can on computer 224 directly set $V_L$ equal to Vss plus one diode voltage drop.

FIGS. 7, 8, and 9 each illustrate the physical layout a portion 370 of a circuit board containing four sets of pin electronics circuitry. FIGS. 7, 8, and 9 illustrate only one portion of one set of pin electronics.

FIG. 7 illustrates a top view of portion 370 of the circuit board containing pin electronics. The physical layout of the circuitry of pin electronics 111 is governed by several considerations. One consideration is that Schottky diodes 123 and 124 should reside as close as possible to hybrid integrated circuit 214, given that hybrid integrated circuit 214 contains comparators 114 and 115.

Another design consideration is that the capacitance on interconnect path 112 should be minimized.

Another goal is to set the impedance of each segment of the interconnect path to approximately 50 ohms. In other words, one of the goals is to impedance match each segment of the interconnect path. This helps to reduce ringing. This also helps to avoid distortion with respect to signals. This also helps to standardize the impedances for each of the pin electronics circuitry for each of the pins of the device under test 4. In other words, this helps to minimize impedance variations between interconnect paths for different pins of DUT 4.

The impedance of each segment of the interconnect path satisfies the following equation:

$$\text{segment impedance} = \sqrt{L/C}.$$

L is the inductance of the segment of the interconnect path and C is the effective capacitance of the segment of the interconnect path.

The relays and switches coupled to the interconnect path tend to be capacitive. The leads of the pin electronics tend to be both capacitive and inductive. The diodes coupled to the interconnect path tend to be capacitive. Parasitic capacitances can be caused by pads, components, diodes, relays, etc.

Capacitance and inductance on segment 370 of the pin electronics circuit board can be controlled in several ways. For example, connection lines can be varied in width and length to vary inductance and capacitance. Connection pads can be varied in size to vary capacitance. Line sections can be segmented.

FIG. 7 shows the top view of the layout of the portion of pin electronics 111. Lead 361 is a portion of interconnect path 112. Segment 361 has an impedance of 50 ohms.

Device under test 4 is coupled to segment 361 of interconnect path 112 via interconnect leads (not shown) that are printed on a flexible material (not shown). Spring connectors then couple those interconnect lines to 50 ohm traces that are then coupled to the leads DUT 4. The 50 ohm traces and spring connectors are not shown.

Trace 363 is another portion of interconnect path 112.

DC parametric measurement reed relay 122 is coupled to trace 363 via pad 365. DC parametric measurement relay 122 is also called switch 122. Trace 363 is then coupled to driver comparator load ("DCL") relay 193, which is also referred to as switch 193. Switch 193 is also coupled in series with interconnect path 112.

DCL relay is in turn coupled to hybrid integrated circuit 214 via trace 367 and trace 369.

Hybrid integrated circuit 214 includes driver 113, comparator 114, comparator 115, and diode bridge 116.

Calibration reed relay 127 is coupled to trace 367. Calibration relay 127 is also referred to switch 127. Calibration relay 127 is coupled to time calibration circuitry 180.

FIG. 8 shows the reverse side of portion of 370 of the pin electronics circuit board.

FIG. 8 shows that Schottky diodes 123 and 124 reside on this bottom side of portion 370 of pin electronics 111. In particular, Schottky diodes 123 and 124 reside approximately underneath DCL relay 193. Schottky diodes 123 and 124 are coupled to the pad 379 that the DCL relay 193 is coupled to.

FIG. 8 also shows area 382 that is on the opposite side of the circuit board from hybrid integrated circuit 214.

FIG. 9 shows a side view of portion 370 of the pin electronics of the ATE test system. FIG. 9 shows the approximate location of measurement relay 122, calibration relay 127, Schottky diodes 123 and 124, and hybrid integrated circuit 214.

As shown in FIGS. 7, 8, and 9, Schottky diodes 123 and 124 reside at a physical location relatively close to hybrid integrated circuit 214. In addition, Schottky diodes 123 and 124 reside relatively far from segment 361 of interconnect path 112.

FIG. 10 illustrates an equivalent circuit for a portion of pin electronics circuitry 111. The equivalent circuit FIG. 10 illustrates various transmission line segments, impedances, time delays, and capacitances found along interconnect path 112.

Transmission line segments 402, 404, 406, 408, and 410 are equivalent segments representing portions of interconnect path 112. Transmission line segments 402, 404, 406, 408, and 410 are each modeled by equivalent inductances and capacitance. Transmission line segments 402, 404, 406, 408, and 410 are each governed by the equation $$t_d = C Z_o = C\sqrt{L/C}.$$

The term $t_d$ is the time delay for the particular transmission line segment. The term $Z_o$ is the impedance of the particular transmission line segment. The team L is the inductance of the particular transmission line segment. The term C is the capacitance of the particular transmission line segment.

Transmission line segment 402 of interconnect path 112 has an impedance $Z_o$ of about 50 ohms and a time delay $t_d$ of about 100 picoseconds.

Transmission line segment 404 of interconnect path 112 then follows. Segment 404 has an impedance of about 100 ohms and a time delay of about 24 picoseconds.

DC parametric measurement circuitry 178 is coupled to interconnect path 112 via line 202 and relay switch 122.

The next portion of interconnect path 112 includes equivalent capacitor 420 with about 2 picofarads of capacitance.

Transmission line segment 406 of interconnect path 112 has an impedance of about 100 ohms and a time delay of about 70 picoseconds.

Interconnect path 112 includes equivalent capacitor 418 with a capacitance of about two picofarads.

DCL relay switch 193 is next along interconnect path 112.

To the left of DCL relay 193 is line 416 that couples Schottky diodes 123 and 124 to interconnect path 112. Schottky diode 123 is coupled to compensation circuit 221 via line 132. Schottky diode 124 is coupled to compensation circuit 221 via line 131.

Interconnect path 112 also includes equivalent capacitor 414 with a capacitance of about 2 picofarads.

To the left of capacitor 414 is transmission line segment 408. Transmission line segment 408 has an impedance of about 100 ohms and a time delay $t_d$ of about 38 picoseconds.

Line 204 going to relay 127 and time calibration circuitry 180 is coupled to the left of segment 408.

Equivalent capacitor 412 is next along interconnect 112. Capacitor 412 has a capacitance of about 2 picofarads.

To the left of capacitor 412 is transmission line segment 410. Transmission line segment 410 has an impedance of about 100 ohms and a time delay of about 38 picoseconds.

Interconnect path 412 is then coupled to hybrid IC 214. Hybrid IC 214 includes driver 113, comparator 114, comparator 115, and diode bridge 116.

When driver circuitry 113 is not engaged, interconnect path 112 terminates at the high impedance inputs 155 and 157 to comparators 114 and 115.

FIG. 11 illustrates another clipping circuit. In FIG. 11, instead of having diodes 123 and 124 connected to interconnect path 112, pin electronics 71 incorporates clipping diodes 83 and 84 coupled to diode bridge circuit 16. Diode bridge circuit 16 is comprised of diodes 62, 64, 66, and 68. Bridge circuit 16 is coupled to current source input $I_{SRC}$, current sink output $I_{SNK}$, and reference voltage $V_{REF}$. Diode bridge circuit 16 is the load circuit of interconnect path 12.

Diodes 83 and 84 are Schottky diodes, which have relatively fast switching speeds. In addition, Schottky diodes have relatively low impedances (when turned on). In an alternative embodiment, Schottky diodes 83 and 84 can be replaced by other types of diodes having fast switching speeds. In another alternative embodiment, diodes 83 and 84 can be replaced by transistors that have fast switching speeds and low impedances.

As shown in FIG. 11, the cathode of clipping diode 83 is coupled to termination clipping high voltage $V_{TCH}$ voltage, and the anode of diode 83 is coupled to the current sink output $I_{SNK}$ of diode bridge circuit 16. The anode of clipping diode 84 is coupled to termination clipping low voltage $V_{TCL}$ voltage, and the cathode of clipping diode 84 is coupled to the current source input $I_{SRC}$ of bridge circuit 16.

When an output signal on pin 19 of DUT 4 rises from a low voltage to a high voltage (i.e., from a logical zero state to a logical one state), the voltage rise triggered by pin 19 and incident on comparator node 18 is bounced back (i.e., reflected) from comparator node 18 towards pin 19. This reflection causes the incident and reflected voltages on interconnect path 12 to add together.

If clipping diode 83 were not connected to diode bridge 16 of FIG. 11, then the amplitude of the reflected voltage would initially typically be double the voltage outputted by pin 19 of DUT 4. This large reflected voltage would typically therefore initially trigger incorrect or false readings by comparators 14 and 15 because this large reflected voltage at node 18 would be applied as an input to comparators 14 and 15.

For the embodiment shown in FIG. 11, however, clipping diode 83 is coupled to current sink output $I_{SNK}$. In one embodiment, termination clipping high voltage $V_{TCH}$ is set to approximately Vcc of DUT 4 (for a CMOS DUT) minus two diode voltage drops. The logical high operating voltage appearing at pin 19 of a CMOS DUT 4 is typically less then Vcc but close to Vcc. As the reflected voltage on interconnect path 12 begins to exceed approximately Vcc, diode 83 is turned on. This clips the voltage level at interconnect path 12 to approximately Vcc, which is equal to approximately $V_{TCH}$ plus a diode 83 voltage drop and a diode 66 voltage drop. During the high voltage period, diode 84 remains in an off condition.

Given that the reflected voltage causes diode 83 to turn on, diode 83 helps to prevent (1) a large voltage reflection back to pin 19 of DUT 4 and (2) a large voltage increase at node 18 induced by reflection. With the initial reflected voltage greatly reduced, the ringing resulting from the transition of the low voltage to the high voltage is also greatly reduced.

If clipping diode 84 were not connected to diode bridge 16 of FIG. 11, then when an output signal dropped from a logical high state (i.e., a high voltage state) to a logical low state (i.e., a low voltage state), the decrease in amplitude of the voltage at node 18 of interconnect path 12 would be additive due to reflection. The reflection would initially typically cause a doubling of the decrease in voltage at node 18 over the true voltage decrease at pin 19.

For the embodiment shown in FIG. 11, however, clipping diode 84 is coupled to current source input $I_{SRC}$. In one embodiment, termination clipping low voltage $V_{TCL}$ is set to approximately Vss of DUT 4 (for a CMOS DUT) plus two diode voltage drops. Vss can be ground. The logical low operating voltage appearing at pin 19 of a CMOS DUT 4 is typically greater than Vss but close to Vss. As the reflected voltage on interconnect path 12 begins to go below approximately Vss, diode 84 is turned on. This clips the voltage level at interconnect path 12 to approximately Vss, which is approximately equal to $V_{TCL}$ minus a diode 84 voltage drop and a diode 68 voltage drop. During the low voltage period, diode 83 remains in an off condition.

Given that the reflected voltage causes diode 84 to turn on, diode 84 helps to prevent (1) a large voltage reflection back to pin 19 of DUT 4 and (2) a large voltage decrease at node 18 induced by reflection. With the initial reflected voltage greatly reduced, the ringing resulting from the transition of the high voltage to the low voltage is also greatly reduced.

Diode bridge 16 is physically coupled to interconnect path 12 at a point near node 18 and far from pin 19 of DUT 4.

FIG. 12 illustrates another embodiment. FIG. 12 illustrates pin electronics 611 that are a portion of test head 610.

Pin electronics 611 includes interconnect path 612, DCL relay 693, node 618, hybrid integrated circuit 714, time calibration circuitry 680, calibration relay switch 627, line 704, DC parametric measurement circuitry 678, measurement relay switch 622, and line 702. Hybrid integrated circuit 714 includes driver 613, comparator 614, comparator 615, and diode bridge 616.

Driver 613 is turned on and off by a signal sent on line 621. Driver 613 includes a data input 651. Comparator 614 includes an input 655. Comparator 615 includes a input 657.

Diode bridge 616 includes Schottky diodes 662, 664, 666, and 668. Schottky diode bridge 616 includes a current source input $I_{SRC}$, a current sink output $I_{SNK}$, and a voltage reference $V_{REF}$. Diode bridge circuitry 616 is a load circuitry of interconnect path 612.

Schottky clipping diodes 684 and 683 are coupled to diode bridge 616 as shown in FIG. 12. Schottky diodes 683 and 684 have relatively high switching speeds. In addition, Schottky diodes 683 and 684 have relatively low impedances when turned on.

In an alternative embodiment, Schottky diodes 684 and 683 are replaced by transistors that have high switching speeds and low impedances.

As shown in FIG. 12, a low voltage $V_L$ is supplied by compensation circuit 721 to the anode of diode 684 via line 631. A high voltage $V_H$ is suppled to the cathode of Schottky diode 683 via line 632 from compensation circuit 721. Compensation circuit 721 is comprised of operational amplifier and diode circuitry.

The ATE system includes a computer 724, a keyboard 726, and a cathode ray tube ("CRT") 728. Computer 724 is coupled to register 722. Register 722 is in turn coupled to digital to analog converter 720. Digital to analog converter 720 is coupled to compensation circuit 721. Digital to analog converter 720 sends both a high voltage $V_{HS}$ and a low voltage $V_{LS}$ to compensation circuit 721. Compensation circuit 721 sends a high voltage $V_H$ to Schottky diode 683 via line 632. Compensation circuit 721 sends a low voltage $V_L$ to Schottky diode 684 via line 631. Voltage $V_H$ is equal to voltage $V_{HS}$ minus two diode voltage drops. Voltage $V_L$ is equal to voltage $V_{LS}$ plus two diode voltage drops.

The user of the ATE can call up the current values of $V_{HS}$ and $V_{LS}$ for the pins of DUT 4 by operating computer 724, keyboard 726, and CRT 728. The user can then use computer 724 to set values for $V_{HS}$ and $V_{LS}$ for each pin of DUT, including pin 19. Computer then sends to register 722 digital information representing the digital values of $V_{HS}$ and $V_{LS}$ for each pin of DUT 4.

Computer 724 allows a user to program on a per pin basis the low and high voltages supplied to the Schottky diodes throughout the ATE. This allows the test system to reduce impedance variations from pin to pin.

In one embodiment, there is circuitry equivalent to register 722, digital to analog converter 720, and compensation circuit 721 on each circuit board of test head 610. For that embodiment, there is a single computer 724 for the ATE.

In alternative embodiments, circuitry equivalent to register 722, digital to analog converter 720, and compensation circuit 721 is repeated for each pin electronics. In yet another alternative embodiment, there is a single register 722, a single digital to analog converter 720, and a single compensation circuit 721 for the ATE.

In an alternative embodiment, compensation circuit 721 is eliminated. Instead, digital to analog converter 720 outputs voltages $V_H$ and $V_L$. For that alternative embodiment, the user sets the values of $V_H$ and $V_L$ directly by using computer 724.

In one embodiment of the present invention, the low voltage $V_L$ supplied by compensation circuit 721 is set to the Vss (or ground) of the device under test 4 plus two diode voltage drops. High voltage $V_H$ supplied by the compensation circuit 721 is set to the Vcc (i.e., the supply voltage of a CMOS DUT 4) minus two diode voltage drops.

As shown in FIG. 12, Schottky diodes 683 and 684 and diode bridge 612 all reside within integrated circuit 714. Thus, Schottky diodes 683 and 684 reside close to node 618 and close to the inputs 655 and 657 to comparators 614 and 615. Moreover, Schottky diodes 683 and 684 reside at the opposite end of the interconnect path from pin 19 of device under test 4.

Schottky diodes 684 and 683 clip overvoltages and undervoltages caused by voltage transitions by device under test 4.

When an output signal on pin 19 of DUT 4 rises from a low voltage to a high voltage (i.e., from a logical zero state to a logical one state), the voltage rise triggered by pin 19 and incident on comparator node 618 is bounced back (i.e., reflected) from comparator node 618 towards pin 19. This reflection causes the incident and reflected voltages on interconnect path 612 to add together.

If clipping diode 683 were not connected to diode bridge 616 of FIG. 12, then the amplitude of the reflected voltage would initially typically be double the voltage outputted by pin 19 of DUT 4. This large reflected voltage would typically therefore initially trigger incorrect or false readings by comparators 614 and 615 because this large reflected voltage at node 618 would be applied as an input to comparators 614 and 615.

For the embodiment shown in FIG. 12, however, clipping Schottky diode 683 is coupled to current sink output $I_{SNK}$. For one embodiment, high voltage $V_H$ is set to approximately Vcc of DUT 4 (for a CMOS DUT) minus two diode voltage drops. As the reflected voltage on interconnect path 612 begins to exceed approximately Vcc, diode 683 is turned on. This clips the high voltage level on interconnect path 612 to a level that is approximately Vcc, which is equal to approximately $V_H$ plus a diode 683 voltage drop and a diode 666 voltage drop. During this high voltage period, diode 684 remains in an off condition.

Given that the reflected voltage turns diode 683 on, diode 683 helps to prevent (1) large voltage reflection back to pin 19 of DUT 4 and (2) a large voltage increase at node 618 induced by reflection. With the initial reflected voltage greatly reduced, the ringing resulting from the transition of the low voltage to the high voltage is also significantly reduced. Thus, ringing is reduced on line 612.

If clipping Schottky diode 684 were not connected to diode bridge 616 of FIG. 12, then when an output signal dropped from a logical high state (i.e., a high voltage state) to a logical low state (i.e., a low voltage state), the decrease in amplitude of the voltage at node 618 of the interconnect path 612 would be additive due to reflection. The reflection would initially typically cause a doubling of the decrease in voltage at node 618 over the true voltage decrease at pin 19.

For the embodiment shown in FIG. 12, however, clipping Schottky diode 684 is coupled to the current source input $I_{SRC}$. In one embodiment, low voltage $V_L$ applied to the anode of Schottky diode 684 is set to approximately Vss of DUT 4 plus two diode voltage drops. As the reflected voltage on interconnect path 612 begins to go below approximately Vss, diode 684 is turned on. This clips the voltage level at interconnect path 612 to approximately Vss, which is equal to approximately $V_L$ minus a diode 684 voltage drop and a diode 668 voltage drop. During the low voltage period, diode 683 remains in an off condition.

Given that the reflected voltage causes diode 684 to turn on, diode 684 helps to prevent (1) a large voltage reflection back to pin 19 of device under test 4 and (2) a large voltage decrease at node 618 induced by reflection. With the initial reflected voltage greatly reduced, the ringing resulting from the transition of the high voltage to the low voltage is also greatly reduced. Therefore, ringing on interconnect path 612 is reduced.

In the foregoing specification the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus for a test system for testing an electronic circuit, comprising:
   (A) an interconnect path having a first end and a second end, wherein the first end of the interconnect path is coupled to the electronic circuit under test, and wherein the interconnect path transmits a signal from the electronic circuit under test to the second end of the interconnect path;
   (B) a comparator coupled to the second end of the interconnect path for receiving and comparing the signal from the electronic circuit under test with a reference voltage, wherein the comparator has a high input impedance, and wherein the comparator provides an output signal to the test system;

(C) programmable means for providing a selectable first voltage and a selectable second voltage, wherein the programmable means comprises:
  (1) a computer for receiving a user input; and
  (2) circuitry responsive to the computer for providing the selectable first voltage and the selectable second voltage;

(D) a first Schottky diode having a first end and a second end for reducing ringing of the signal from the electronic circuit under test, wherein the first end of the first Schottky diode is coupled to the interconnect path at a point near the comparator, and wherein the second end of the first Schottky diode is coupled to the selectable first voltage;

(E) a second Schottky diode having a third end and a fourth end for reducing ringing of the signal from the electronic circuit under test, wherein the third end of the second Schottky diode is coupled to the selectable second voltage, and wherein the fourth end of the second Schottky diode is coupled to the interconnect path at the point near the comparator.

2. The apparatus of claim 1 for a test system for testing an electronic circuit, wherein the first voltage is a high voltage equal to a supply voltage of the electronic circuit under test and wherein the second voltage is a low voltage equal to ground.

3. The apparatus of claim 1 for a test system for testing an electronic circuit, wherein the circuitry responsive to the computer comprises a digital to analog converter.

4. The apparatus of claim 1 for a test system for testing an electronic circuit wherein the first end of the first Schottky diode is an anode of the first Schottky diode and the second end of the first Schottky diode is a cathode of the first Schottky diode, wherein the third end of the second Schottky diode is an anode of the second Schottky diode and the fourth end of the second Schottky diode is a cathode of the second Schottky diode.

5. An apparatus for a test system for testing an electronic circuit, comprising:
(A) an interconnect path having a first end and a second end, wherein the first end of the interconnect path is coupled to the electronic circuit under test, and wherein the interconnect path transmits a signal from the electronic circuit under test to the second end of the interconnect path;

(B) a comparator coupled to the second end of the interconnect path for receiving and comparing the signal from the electronic circuit under test with a reference voltage, wherein the comparator has a high input impedance, and wherein the comparator provides an output signal to the test system;

(C) a first Schottky diode having an anode and a cathode for reducing ringing of the signal from the electronic circuit under test, wherein the anode of the first Schottky diode is coupled to the interconnect path at a point near the comparator, and wherein the cathode of the first Schottky diode is coupled to a selectable high voltage;

(D) a second Schottky diode having an anode and a cathode for reducing ringing of the signal from the electronic circuit under test, wherein the anode of the second Schottky diode is coupled to a selectable low voltage, and wherein the cathode of the second Schottky diode is coupled to the interconnect path at the point near the comparator; and (E) programmable means for providing the selectable high voltage and the selectable low voltage, wherein the programmable means comprises:
  (1) a computer for receiving a user input to set a first value corresponding to the selectable high voltage and a second value corresponding to the selectable low voltage; and
  (2) a digital to analog converter coupled to the computer for receiving the first value and the second value from the computer and for converting the first value into the selectable high voltage and the second value into the selectable low voltage.

6. The apparatus of claim 5 for a test system for testing an electronic circuit, wherein the programmable means further comprises a compensation circuit coupled to the digital to analog converter, wherein the digital to analog converter converts the first value into the selectable high voltage plus one diode voltage drop and converts the second value into the selectable low voltage plus one diode voltage drop, wherein the compensation circuit (i) receives the selectable high voltage plus one diode voltage drop and the selectable low voltage plus one diode voltage drop and (ii) provides the selectable high and low voltages.

* * * * *